(12) United States Patent
Maeda et al.

(10) Patent No.: US 10,002,670 B2
(45) Date of Patent: Jun. 19, 2018

(54) MEMORY AND MEMORY CONTROL METHOD

(71) Applicant: FUJITSU LIMITED, Kawasaki-shi, Kanagawa (JP)

(72) Inventors: Masazumi Maeda, Yokohama (JP); Masahiro Ise, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/465,700

(22) Filed: Mar. 22, 2017

(65) Prior Publication Data

US 2017/0301401 A1 Oct. 19, 2017

(30) Foreign Application Priority Data

Apr. 18, 2016 (JP) .................................. 2016-083100

(51) Int. Cl.
*G11C 16/16* (2006.01)
*G11C 16/10* (2006.01)
*G11C 16/34* (2006.01)
*G11C 16/26* (2006.01)

(52) U.S. Cl.
CPC .............. *G11C 16/16* (2013.01); *G11C 16/10* (2013.01); *G11C 16/26* (2013.01); *G11C 16/3459* (2013.01)

(58) Field of Classification Search
CPC ..................................................... G11C 16/16
USPC ..................................................... 365/185.29
See application file for complete search history.

(56) References Cited

U.S. PATENT DOCUMENTS

| | | | | |
|---|---|---|---|---|
| 2004/0004245 A1* | 1/2004 | Forbes | ................ | G11C 11/5671 257/315 |
| 2007/0030747 A1* | 2/2007 | Hirai | .................. | G11C 13/0033 365/222 |
| 2009/0097323 A1* | 4/2009 | Bode | .................. | G11C 16/3418 365/185.21 |
| 2010/0238729 A1* | 9/2010 | Lee | ..................... | G11C 11/5628 365/185.11 |
| 2010/0302849 A1* | 12/2010 | Jung | ..................... | G11C 11/005 365/185.08 |
| 2011/0103150 A1* | 5/2011 | Chan | .................. | G11C 16/0483 365/185.19 |
| 2014/0003125 A1* | 1/2014 | Koushan | ............ | G11C 13/0002 365/148 |

FOREIGN PATENT DOCUMENTS

JP 2002-208286 7/2002
WO 2015/155860 10/2015

* cited by examiner

*Primary Examiner* — Hoai V Ho
*Assistant Examiner* — Muna A Techane
(74) *Attorney, Agent, or Firm* — Fujitsu Patent Center

(57) ABSTRACT

A memory includes a memory cell including a memory transistor in which electric charges are stored in an electric charge storage layer when data is written to the memory cell, and a controller configured to control a voltage to be applied to the memory transistor in a predetermined hold time until an amount of electric charges stored in the electric charge storage layer decreases to an amount of electric charges corresponding to a state where the data is erased from the memory cell.

8 Claims, 13 Drawing Sheets

FIG. 3

| SIGNAL LINE | WRITE CONTROL | READ CONTROL | ERASE CONTROL | STANDBY | |
|---|---|---|---|---|---|
| | | | | NO HOLD TIME CONTROL | HOLD TIME CONTROL |
| WORD LINE WL (CONTROL GATE CG) | +12V | +5V | 0V | 0V | 0V |
| BIT LINE (DRAIN DR) | +8V | +1V | FLOATING | 0V | FLOATING |
| SOURCE LINE (SOURCE SC) | 0V | 0V | +12V | 0V | +αV (α<12) |

(+α:VOLTAGE VALUE CALCULATED DEPENDING ON HOLD TIME)

FIG. 9

| SIGNAL LINE | WRITE CONTROL | READ CONTROL | ERASE CONTROL | STANDBY | |
|---|---|---|---|---|---|
| | | | | NO HOLD TIME CONTROL | HOLD TIME CONTROL |
| WORD LINE WL (CONTROL GATE CG) | +20V | 0V (SELECTED) +5V (NOT SELECTED) | 0V | 0V | 0V |
| BIT LINE (DRAIN DR) | 0V | +1V | +20V | 0V | +αV (α<20) |
| SOURCE LINE (SOURCE SC) | 0V | 0V | +20V | 0V | +αV (α<20) |
| SUBSTRATE POWER SUPPLY LINE (SEMICONDUCTOR SUBSTRATE SUB) | 0V | 0V | +20V | 0V | +αV (α<20) |

(+α:VOLTAGE VALUE CALCULATED DEPENDING ON HOLD TIME)

MEMORY AND MEMORY CONTROL METHOD

CROSS-REFERENCE TO RELATED APPLICATION

This application is based upon and claims the benefit of priority of the prior Japanese Patent Application No. 2016-083100, filed on Apr. 18, 2016, the entire contents of which are incorporated herein by reference.

FIELD

The embodiments discussed herein are related to a memory and a memory control method.

BACKGROUND

International Publication Pamphlet No. WO 2015/155860, for example, discusses a method for setting a write verify voltage and an erase verify voltage depending on a write data secure period, namely a data hold time, in a non-volatile memory such as a flash memory. The write verify voltage and the erase verify voltage are reference voltages to be referred to when a verify operation for checking the threshold voltage of a memory transistor is performed.

SUMMARY

According to an aspect of the invention, a memory includes a memory cell including a memory transistor in which electric charges are stored in an electric charge storage layer when data is written to the memory cell, and a controller configured to control a voltage to be applied to the memory transistor in a predetermined hold time until an amount of electric charges stored in the electric charge storage layer decreases to an amount of electric charges corresponding to a state where the data is erased from the memory cell.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram representing examples of voltages to be supplied to word lines, bit lines and source lines which are illustrated in FIG. 2;

FIG. 9 is a diagram representing examples of voltages to be supplied to word lines, bit lines, source lines and a substrate power supply line which are illustrated in FIG. 8;

DESCRIPTION OF EMBODIMENTS

After a write operation, a threshold voltage of a memory transistor decreases with time, due to natural discharge of electric charges stored in a floating gate. For this reason, a write verify voltage and an erase verify voltage to be set depending on a data hold time are determined based on an amount of the decrease in the threshold voltage which occurs due to the natural discharge of the stored electric charges from the floating gate. In this case, the data hold time depends on the natural discharge. During the natural discharge, the amount of electric charges extracted from the floating gate varies depending on the operating environment and the like. For this reason, as long as the memory control method depending on the natural discharge is used, it is difficult to control the data hold time accurately.

An object of an aspect of embodiments is to provide a memory and a memory control method both capable of controlling the data hold time accurately.

Using the drawings, descriptions will be provided for embodiments.

Figure 1:
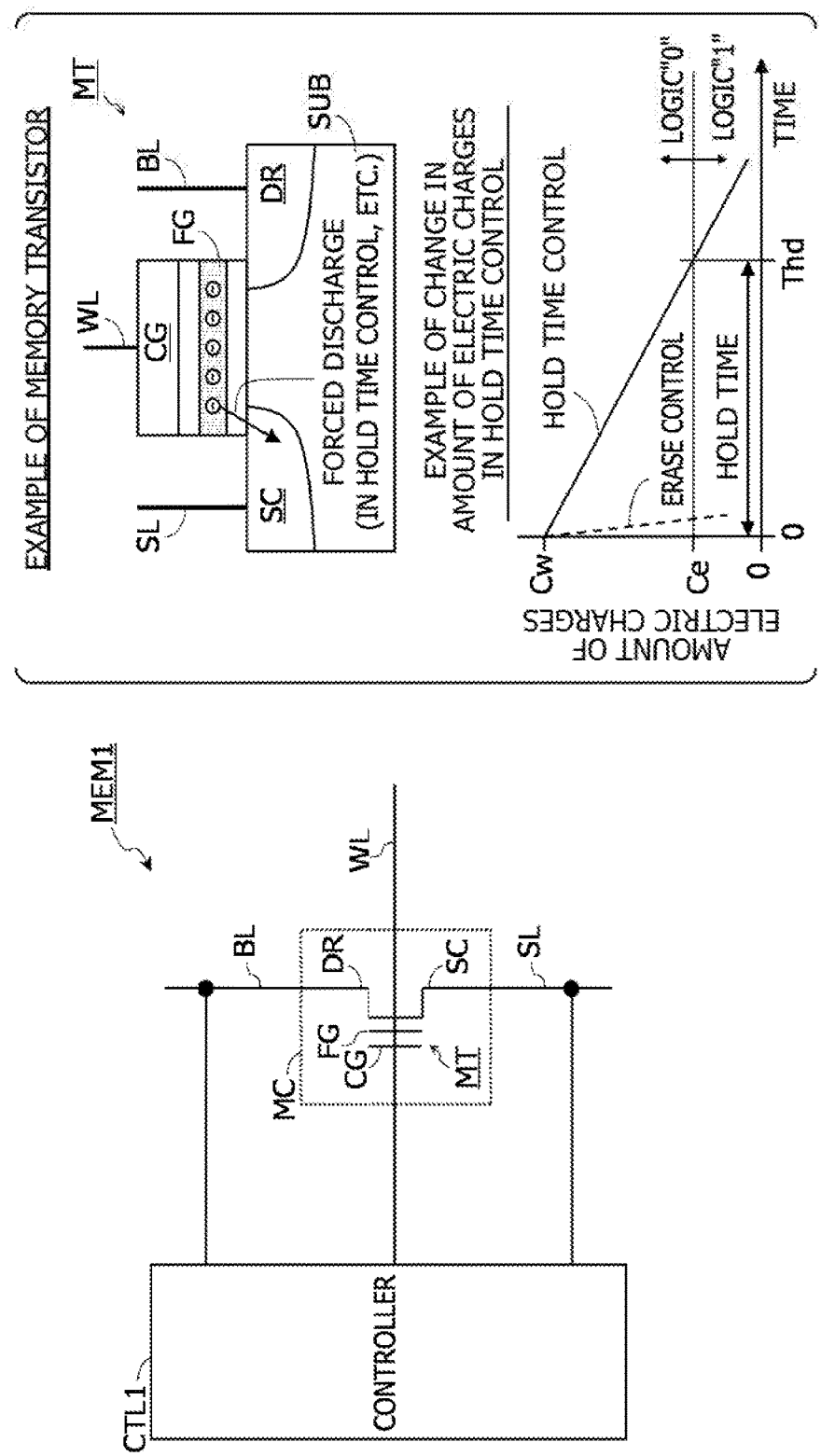
FIG. 1 is a diagram illustrating a memory and a memory control method of an embodiment.

FIG. 1 illustrates an embodiment of the memory and the memory control method. A memory MEM1 illustrated in FIG. 1 is, for example, a non-volatile semiconductor memory such as a flash memory. In general, a non-volatile semiconductor memory such as a flash memory stores data depending on the presence or absence of electric charges, and is classified into either a floating gate memory or a charge trap memory. The floating gate memory injects electric charges into the entirety of a conductor which is termed as a floating gate. The charge trap memory injects electric charges into a layer such as a silicon nitride film, which is termed as a charge trap layer.

The following descriptions will be provided using the floating gate memory as an example of the memory MEM1. Nevertheless, the memory MEM1 is not limited to the floating gate memory. The electric charge storage layer may be the charge trap layer of the charge trap memory, for example.

The memory MEM1 includes at least one non-volatile memory cell MC, and a controller CTL1. The memory cell MC includes a memory transistor MT in which electric charges are stored into the floating gate FG during the data writing. In FIG. 1, a diagram in the parentheses illustrates an example of the memory transistor MT whose floating gate FG stores electrons (negative electric charges), and a graph in the parentheses illustrates an example of the change in the amount of electric charges stored in the floating gate FG.

Meanwhile, in the graph in the parentheses in FIG. 1, the solid line represents an example of how the amount of electric charges changes while a hold time control is being performed in order to control how long the data having written to the memory transistor MT is retained. In the graph in the parentheses in FIG. 1, the dashed line represents an example of how the amount of electric charges changes while an erase control is being performed in order to erase the data having written to the memory transistor MT. For example, an electronic device in which the memory MEM1 is mounted achieves part of the security function by use of the hold time control by the memory MEM1. Examples of the electronic device in which the memory MEM1 is mounted include a removable media and a computer.

FIG. 1 illustrates an example where the memory transistor MT uses an n-channel metal oxide semiconductor (MOS) transistor. For example, the memory transistor MT includes: a p-type semiconductor substrate SUB including a source SC and a drain DR which are n-type regions, the floating gate FG, and a control gate CG. The floating gate FG is disposed with an insulating layer interposed between the semiconductor substrate SUB and the control gate CG. Incidentally, the memory transistor MT may use a p-channel MOS transistor. The polarities of the voltages to be applied to the memory transistor MT using the p-channel MOS transistor are reverse to the polarities of the voltages to be applied to the memory transistor MT using the n-channel MOS transistor.

In the memory transistor MT, the source SC, the control gate CG and the drain DR are connected to the controller CTL1 via a source line SL, a word line WL and a bit line BL. In a case where the memory cells MC are arrayed in a matrix layout, the control gates CG of the memory transistors MR arranged in the same row are connected to a common word line WL. The memory transistor MT changes the threshold voltage according to the amount of electric charges stored in the floating gate FG, and thus stores a data logic according to the threshold voltage. For example, a data stored in the memory transistor MT is determined based on whether or not the threshold voltage is greater than a predetermined determination value (a threshold voltage associated with an electric charge amount Ce illustrated in FIG. 1).

The controller CTL1 performs: a write control for writing data to the memory transistor MT; an erase control for erasing the thus-written data from the memory transistor MT; and a read control from reading the data from the memory transistor MT. By controlling the voltage to be applied to the memory transistor MT, the controller CTL1 further performs the hold time control for extracting the stored electric charges from the floating gate FG in a predetermined hold time Thd until the amount of electric charges remaining in the floating gate FG becomes equal to the electric charge amount Ce corresponding to a condition where the data is erased from the memory transistor MT. FIG. 1 illustrates how the controller CTL1 works in a case where the memory MEM1 is a NOR flash memory. Incidentally, the memory MEM1 is limited to the NOR flash memory.

In the write control, a positive gate voltage for write and a positive drain voltage for write are applied, respectively, to the control gate CG and the drain DR of the memory transistor MT of the write target; and grounding the source SC. The positive gate voltage for write and the positive drain voltage for write will be hereinafter referred to as a "write gate voltage" and a "write drain voltage" as well, respectively.

For example, the write drain voltage is set at a voltage for producing hot electrons using an electric current flowing between the source SC and the drain DR. Meanwhile, the write gate voltage is set at a voltage for injecting the hot electrons, produced by the electric current flowing between the source SC and the drain DR, into the floating gate FG. By the write control, the electrons are injected into the floating gate FG, and thus raise the threshold voltage of the memory transistor MT.

In the erase control, the controller CTL1 applies a positive source voltage for erase to the source SC of the memory transistor MT of the erase target; grounds the control gate CG; and puts the drain DR in a floating state. The positive source voltage for erase will be hereinafter referred to as an "erase source voltage" as well. The erase source voltage is set at a voltage for extracting the stored electrons from the floating gate FG to the source SC through the tunnel effect. By the erase control, the electrons are extracted from the floating gate FG, and thus decrease the threshold voltage of the memory transistor MT.

In the write control, the controller CTL1 applies a positive gate voltage for read and a positive drain voltage for read, respectively, to the control gate CG and the drain DR of the memory transistor MT of the read target; and grounds the source SC. The positive gate voltage for read and the positive drain voltage for read will be hereinafter referred to as a "read gate voltage" and a "read drain voltage" as well, respectively.

For example, the read drain voltage is set at a voltage less than the write drain voltage in order that no hot electrons may be produced. The read gate voltage is set at a voltage which is less than the threshold voltage of the memory transistor MT in the write state where the electrons are stored in the floating gate FG, and which is greater than the threshold voltage of the memory transistor MT in the erase state where no electrons are stored in the floating gate FG. In the case illustrated in FIG. 1, the read gate voltage is set at a value which the threshold voltage of the memory transistor MT takes on when electric charges in the electric charge amount Ce are stored in the floating gate FG.

In a case where the threshold voltage of the memory transistor MT is less than the read gate voltage (or in the erase state), the electric current flows between the source SC and the drain DR. Thereby, it is determined that the electric current between the source SC and the drain DR is greater than the reference current, and a logic "1" is read. Meanwhile, in a case where the threshold voltage of the memory transistor MT is greater than the read gate voltage (or in the write state), no electric current flows between the source SC and the drain DR. Thereby, it is determined that the electric current between the source SC and the drain DR is less than the reference current, and a logic "0" is read.

In the hold time control, the controller CTL1 applies a positive source voltage for hold time control to the source SC of the memory transistor MT of the hold time control target; grounds the control gate CG; and puts the drain DR in a floating state. The positive source voltage for hold time control will be hereinafter referred to as a "hold time control source voltage" as well. The hold time control source voltage is set at a voltage for extracting the stored electric charges from the floating gate FG in the predetermined hold time Thd until the threshold voltage becomes less than the read gate voltage.

Here, the hold time control will be discussed using the graph in the parentheses in FIG. 1. In the graph in the parentheses in FIG. 1, the vertical axis represents the amount of electric charges stored in the floating gate FG, while the horizontal axis represents how long a time has elapsed since the start of the hold time control. An electric current amount Cw represents an amount of electric charges which are stored in the floating gate FG when the write control is completed. In addition, the electric current amount Ce represents an amount of electric currents which are stored in the floating gate FG when the threshold voltage of the memory transistor MT is less than the read gate voltage. In other words, the state where the amount of electric charges stored in the floating gate FG is equal to or less than the electric current amount Ce corresponds to the state where data is erased from the memory transistor MT. The electric current amounts Cw, Ce are calculated, for example, by simulations or the like when the memory transistor MT is designed.

In the hold time control, for example, the electric charges are discharged by an electric charge amount (Cw−Ce), which is a differential between the electric current amount Cw and the electric current amount Ce, in the hold time Thd in a forced manner. In other words, in the hold time control, electric charges are extracted from the floating gate FG by (Cw−Ce)/Thd per unit time. Accordingly, after the hold time elapses, the electric charges to be stored in the floating gate FG becomes equal to the electric charge amount Ce, and the threshold voltage of the memory transistor MT becomes less than the read gate voltage.

For this reason, when the memory transistor MT is designed, the hold time control source voltage is calculated by simulations or the like such that electric charges are extracted from the floating gate FG by the electric charge amount (Cw−Ce) in the hold time Thd at the per-unit-time rate of (Cw−Ce)/Thd.

As the result of the hold time control, the threshold voltage of the memory transistor MT of the hold time control target becomes less than the read gate voltage when the hold time Thd elapses after the start of the hold time control. Thus, the stored data (data representing the logic "0") is erased from the memory transistor MT. Incidentally, in the erase control, the stored electric charges are extracted from the floating gate FG to the electric charge amount Ce within a time shorter than the time taken for the hold time control (indicated with the dashed line in the graph in FIG. 1).

As described above, the memory MEM1 controls the hold time Thd by discharging the stored electric charges from the floating gate FG in the forced manner through the hold time control. The memory MEM1 controls the hold time without depending on the natural discharge. For this reason, the memory MEM1 is capable of reducing a variation in the hold time compared with when the data hold time depends on the natural discharge (for example, compared with a comparative example illustrated in FIG. 4). For example, as (Cw−Ce)/Thd, representing the amount of electric charges to be discharged per unit time through the hold time control increases more over an average amount of electric charges to be discharged through the natural discharge, the influence of the natural discharge becomes smaller, and the variation in the hold time accordingly becomes smaller. Incidentally, the configuration of the memory MET1 is not limited to the example illustrated in FIG. 1.

In the embodiment illustrated in FIG. 1, as described above, the controller CTL1 writes the data to the memory cell MC by storing the electric charges in the floating gate FG of the memory transistor MT included in the memory cell MC. Furthermore, by controlling the voltage to be applied to the memory transistor MT, the controller CTL1 performs the hold time control for extracting the stored electric charges from the floating gate FG in the predetermined hold time Thd until the amount of electric charges remaining in the floating gate FG becomes equal to the electric charge amount Ce corresponding to the state where the data is erased from the memory transistor MT. Thereby, the variation in the hold time is reduced compared with the control method depending on the natural discharge. In other words, the data hold time is controlled accurately.

Figure 2:
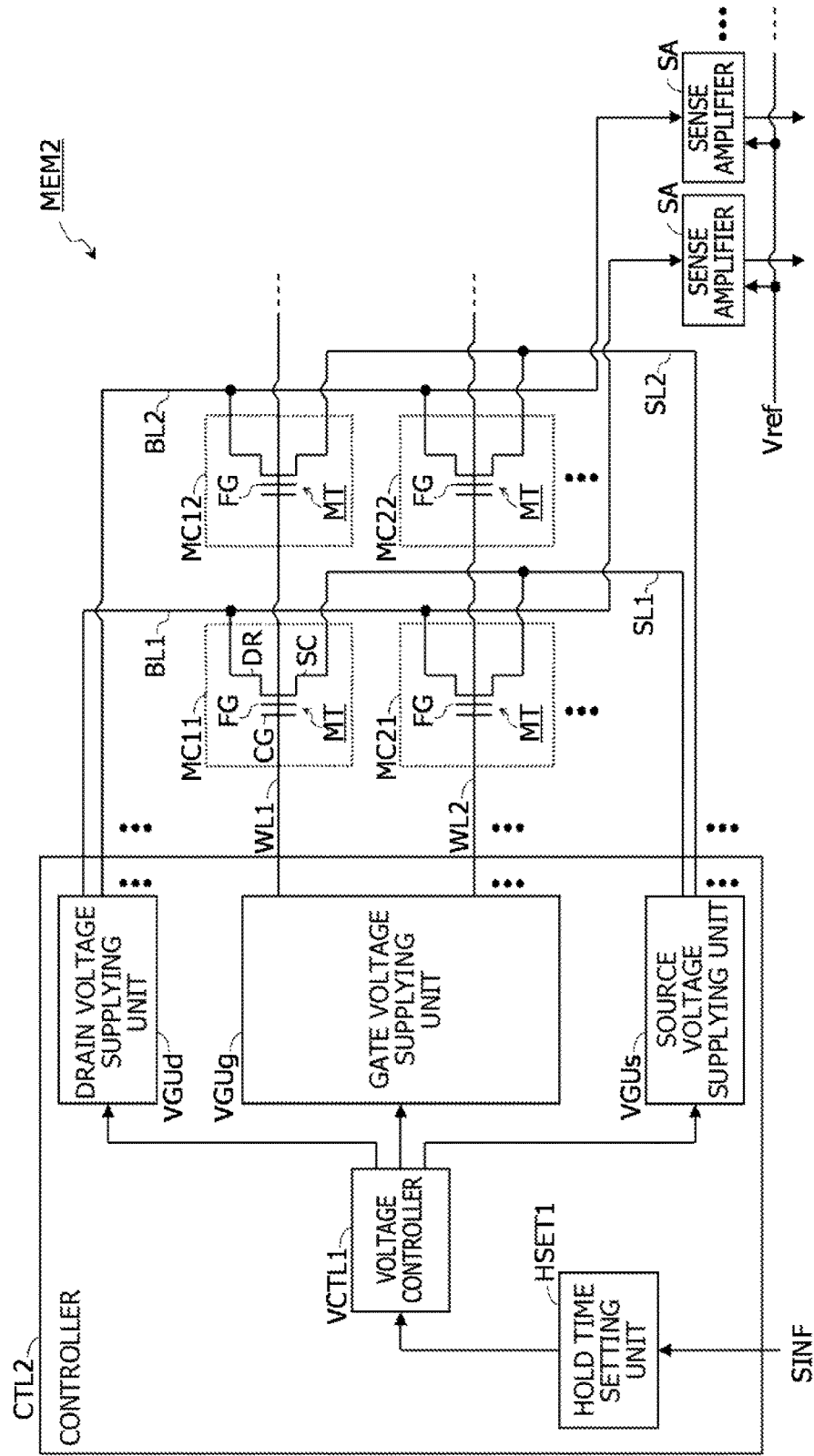
FIG. 2 is a diagram illustrating a memory and a memory control method of another embodiment.

FIG. 2 illustrating a memory and a memory control method of another embodiment. Components which are the same as or similar to those discussed using FIG. 1 will be denoted by the same or similar reference signs, and detailed descriptions for such components will be omitted. A memory MEM2 illustrated in FIG. 2 includes a controller CTL2 instead of the controller CTL1 illustrated in FIG. 1. The memory MEM2 further includes sense amplifiers SA, unlike the memory MEM1 illustrated in FIG. 2. The rest of the configuration of the memory MEM2 is the same as or similar to that of the configuration of the memory MEM1 illustrated in FIG. 1. For example, the memory MEM2 is a NOR flash memory including: multiple non-volatile memory cells MC (MC11, MC12, MC21, MC22, . . . ) arrayed in a matrix layout; the controller CTL2; and the multiple sense amplifiers SA.

Each memory cell MC includes a memory transistor MT where electric charges are stored in the floating gate FG when the data is written to the memory transistor MT. Incidentally, the illustration in FIG. 2 omits reference signs denoting the sources SC, the control gates CG and the drains DR of the memory transistors MT included in the memory cells MC12, MC21, MC22 for the purpose of making the drawing easy to look at. In the example illustrated in FIG. 2, each memory transistor MT uses an n-channel MOS transistor.

The drains DR of the memory transistors MT of the memory cells MC arranged in the same column are connected to a common bit line BL, and the sources SC thereof are connected to a common source line SL. Meanwhile, the control gates CG of the memory transistors MT of the memory cells MC arranged in the same row are connected to a common word line WL. The source line SL, the word line WL and the bit line BL are connected to the controller CTL2. Furthermore, the bit line BL is connected to a corresponding one of the sense amplifiers SA.

The sense amplifiers SA are provided to the respective columns of the memory cells MC arrayed in the matrix layout. Each sense amplifier SA is connected to the bit line BL in the corresponding column. For example, each sense amplifier SA compares a voltage generated based on an electric current between the sources SC and the drains DR of the corresponding memory transistors MT with a reference voltage Vref, and outputs a result of the comparison to the controller CTL2 and the like.

The controller CTL2 is the same as or similar to the controller CTL1 illustrated in FIG. 1. For example, the controller CTL2 performs the write control, the erase control, the read control and the hold time control. The controller CTL2 includes a hold time setting unit HSET1, a voltage controller VCTL1, a drain voltage supplying unit VGUd, a gate voltage supplying unit VGUg, and a source voltage supplying unit VGUs. The drain voltage supplying unit VGUd, the gate voltage supplying unit VGUg, and the source voltage supplying unit VGUs will be hereinafter referred to as "voltage supplying units VGU (VGUd, VGUg, VGUs)" as well, respectively.

The hold time setting unit HSET1, for example, receives setting information SINF about the setting of the data hold time from the outside of the memory MEM2, and sets the data hold time at a predetermined hold time Thd based on the setting information SINF. Thereafter, the hold time setting unit HSET1 notifies a result of the setting of the data hold time to the voltage controller VCTL1. The setting information SINF includes: time information about the predetermined hold time Thd; and area information about a memory cell MC in which to set the data hold time during the predetermined hold time Thd. In the example illustrated in FIG. 2, the data hold time is set for each column of the memory cells MC arrayed in the matrix layout. Incidentally, mutually-different data hold times may be set in the respective columns of the memory cells MC. Otherwise, a common data hold time may be set in the multiple columns of the memory cells MC.

For example, in a case where the area information included in the setting information SINF indicates the memory cells MC (MC11, MC21) arranged in a first column, the hold time setting unit HSET1 sets the data hold time for the memory cells MC arranged in the first column at the predetermined hold time Thd. Thereafter, the hold time setting unit HSET1 outputs to the voltage controller VCTL1 information that the hold time setting unit HSET1 sets the data hold time for the memory cells MC arranged in the first column at the predetermined hold time Thd. In this manner, based on the setting information SINF, the hold time setting unit HSET1 sets the data hold time at the predetermined hold time Thd in specific ones of the multiple memory cells MC.

Meanwhile, the predetermined hold time Thd may be selected from multiple candidate values prepared in advance, or may be fixed at a single set value. In the case where the predetermined hold time Thd is fixed at the single set value, the time information may be omitted from the setting information SINF. Furthermore, the column of the memory cells MC in which to set the data hold time at the predetermined hold time Thd may be determined in advance, or may be selected from multiple candidates. In the case where the column of the memory cells MC in which to set the data hold time at the predetermined hold time Thd is determined in advance, the area information may be omitted from the setting information SINF. On the other hand, in the case where: the predetermined hold time Thd is fixed at the single set value; and the column of the memory cells MC in which to set the data hold time at the predetermined hold time Thd is determined in advance, the setting information SINF may be information about whether to enable the hold time control.

The voltage controller VCTL1 applies voltages to the drain DR, the control gate CG and the source SC of each memory transistor MT by controlling the voltage supplying units VGU (VGUd, VGUg, VGUs). For example, the voltage controller VCTL1 controls the voltage supplying units VGU (VGUd, VGUg, VGUs) such that voltages illustrated in FIG. 3 are applied to the memory transistors MT depending on the write control, the read control, the erase control, and the standby mode.

When in the standby mode where none of the write control, the read control and the erase control is performed, the voltage controller VCTL1 performs voltage controls which are different from the memory transistors MT of the hold time control target and the memory transistors MT not assigned as the hold time control targets. To this end, when the data hold time is set, the voltage controller VCTL1 controls the source voltage supplying unit VGUs so as to generate the source voltage (source voltage for hold time control) according to the set hold time.

The drain voltage supplying unit VGUd generates the write drain voltage, the read drain voltage and the like, and applies the drain voltages suitable for each control to the drains DR of the memory transistors MT via the bit lines BL.

The gate voltage supplying unit VGUg generates the write gate voltage, the read gate voltage and the like, and applies the gate voltages suitable for each control to the control gates CG of the memory transistors MT via the word lines WL.

The source voltage supplying unit VGUs generates the erase source voltage, the hold time control source voltage and the like, and applies the source voltages suitable for each control to the sources SC of the memory transistors MT via the source lines WL. Incidentally, the source voltage supplying unit VGUs generates the hold time control source voltage such that the hold time control source voltage becomes equal to a voltage value corresponding to the data hold time.

As discussed above, the controller CTL2 sets the data hold time at the predetermined hold time Thd in the specific ones of the multiple memory cells MC, and performs the hold time control on the memory cells MC in which the data hold time is set at the predetermined hold time Thd. Thereby, depending on what purpose or the like the memory MEM2 serves, the memory MEM2 is capable of changing a ratio between the memory cells MC in which the data hold time is set at the predetermined hold time Thd and the memory cells MC in which the data hold time is not set at the predetermined hold time Thd.

Meanwhile, the configuration of the memory MEM2 is not limited to the example illustrated in FIG. 2. For example, the data hold time may be set in each of the columns of the multiple memory cells MC arrayed in the matrix layout. In this case, for each columns constituting a unit block in which the data hold time is set at the predetermined hold time Thd, the sources SC of the memory transistors MT may be connected to a common source line SL. Furthermore, the memory MEM2 may include: memory cells MC in which the data hold time may be set at the predetermined hold time Thd; and memory cells MC not corresponding to the data hold time setting. In this case, for each unit block from the data is erase, the sources SC of the memory transistors MT of the memory cells not corresponding to the data hold time setting may be connected to a common source line SL.

In addition, each memory transistor MT may use a P-channel MOS transistor. In this case, the polarities of the voltages to be applied to the memory transistor MT are reverse to the polarities of the voltages to be applied to the memory transistor MT using the n-channel MOS transistor (for example, the voltages illustrated in FIG. 3).

FIG. 3 illustrates examples of the voltages to be supplied to the word lines WL, the bit lines BL and the source lines SL which are illustrated in FIG. 2.

In the write control, the voltage supplying units VGUg, VGUd, VGUs supply voltages of +12 V, +8 V, and 0 V, respectively, to the word lines WL, the bit lines BL and the source lines SL connected to memory transistors MT of the write targets. Thereby, the +12-V voltage, the +8-V voltage and the 0-V voltage are applied respectively to the control gates CG, the drains DR and the sources SC of the memory transistors MT of the write targets. Incidentally, a voltage control which is the same as performed for the standby mode is performed on the word lines WL, the bit lines BL and the source lines SL which are not connected to the memory transistors MT of the write targets.

In the read control, the voltage supplying units VGUg, VGUd, VGUs supply voltages of +5 V, +1 V, and 0 V, respectively, to the word lines WL, the bit lines BL and the source lines SL connected to memory transistors MT of the read targets. Thereby, the +5-V voltage, the +1-V voltage, and the 0-V voltage are applied respectively to the control gates CG, the drains DR and the sources SC of the memory transistors MT of the read targets. Incidentally, the voltage control which is the same as performed for the standby mode is performed on the word lines WL, the bit lines BL and the source lines SL which are not connected to the memory transistors MT of the read targets.

In the erase control, the voltage supplying units VGUg, VGUs supply voltages of 0 V and +12 V, respectively, to the word lines WL and the source lines SL connected to memory transistors MT of the erase targets. Concurrently, the voltage supplying unit VGUd puts the bit lines BL connected to the memory transistors MT of the erase targets in a floating state. Thereby, the 0-V voltage and the +12-V voltage are applied respectively to the control gates CG and the sources SC of the memory transistors MT of the erase targets, and the drains DR of the memory transistors MT of the erase targets are put in the floating state. Incidentally, the voltage control which is the same as performed for the standby mode is performed on the word lines WL, the bit lines BL and the source lines SL which are not connected to the memory transistors MT of the read targets.

In the standby mode, the controller CTL2 performs voltage controls which are different from the memory cells MC in which the data hold time is set at the predetermined hold time Thd and the memory cells MC in which the data hold time is not set at the predetermined hold time Thd. In FIG. 3, the column "No Hold Time Control" represents the voltage control to be performed on the memory cells MC in which the data hold time is not set at the predetermined hold time Thd. For example, in the hold time control, the voltage supplying units VGUg, VGUd, VGUs supply a 0-V voltage to the word lines WL, the bit lines BL and the source lines SL. In other words, in the hold time control, the 0-V voltage is applied to the control gates CG, the drains DR and the sources SC of the memory transistors MT.

Meanwhile, in the hold time control, the voltage supplying units VGUg, VGUs supply voltages of 0 V and +α V, respectively, to the word lines WL and the source lines SL connected to memory transistors MT of the hold time control targets. In this respect, the +α-V voltage is a voltage value which is calculated depending on the hold time, and which is less than the +12-V voltage to be applied to the sources SC of the memory transistors MT of the erase targets. Furthermore, the voltage supplying unit VGUd puts the bit lines BL connected to the memory transistors MT of the hold time control targets in the floating state.

By this, the 0-V voltage and the +α-V voltage are applied respectively to the control gates CG and the sources SC of the memory transistors MT of the hold time control targets, and the drains DR of the memory transistors MT of the hold time control targets are put in the floating state. A voltage control which is the same as performed while the hold time control is not performed is performed on the word lines WL, the bit lines BL and the source lines SL which are not connected to the memory transistors MT of the hold time control targets.

Meanwhile, the voltages to be supplied to the word lines WL, the bit lines BL and the source lines SL for each control are not limited to the examples illustrated in FIG. 3. For example, a voltage greater than 0 V may be applied to the control gates CG of the memory transistors MT of the hold time control targets. In this case, a voltage for making the potential difference between the sources SC and the control gates CG become equal to +α V is applied to the sources SC of the memory transistors MT of the hold time control targets.

Figure 4:
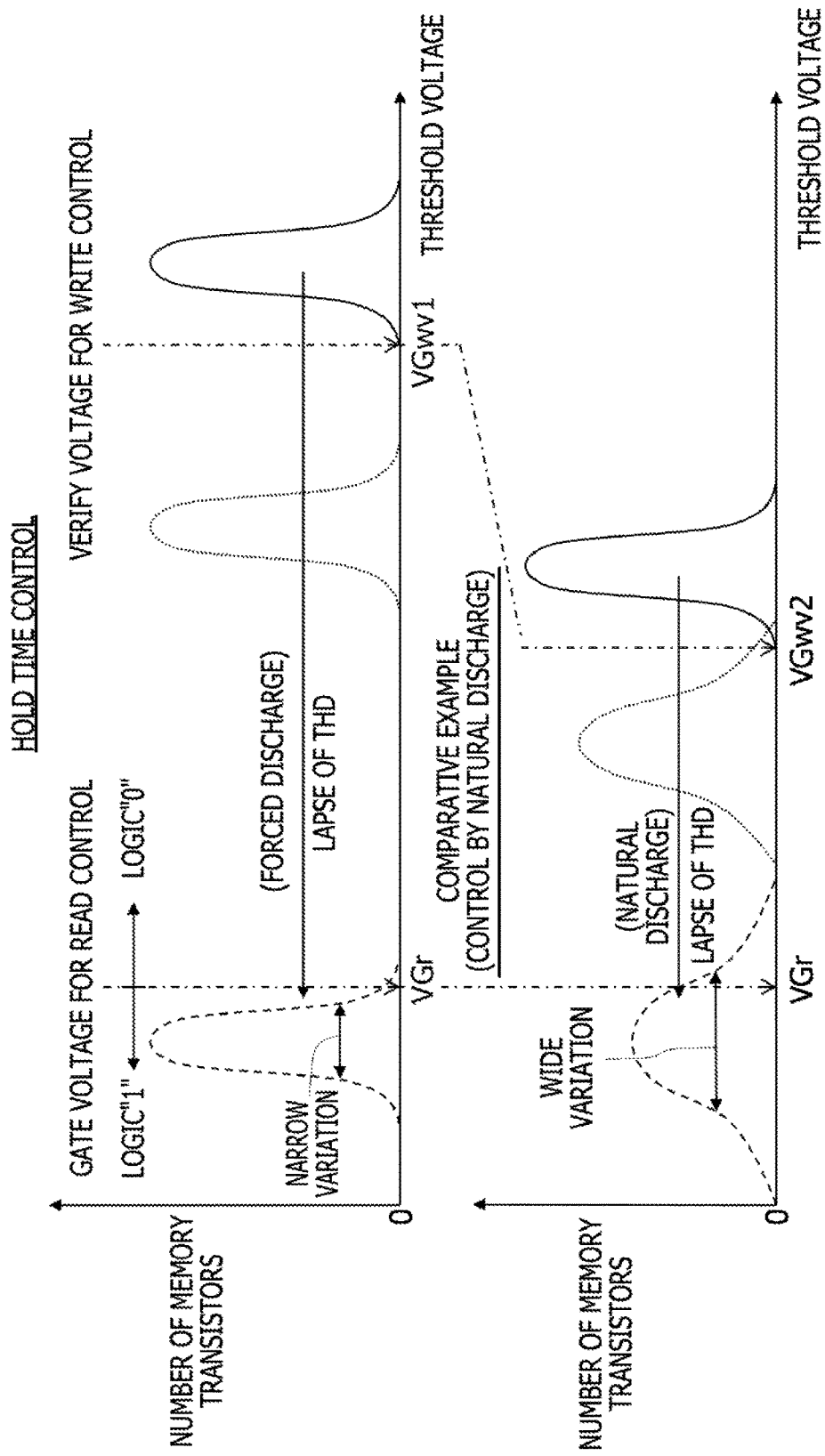
FIG. 4 is a diagram illustrating examples of changes in threshold voltages of memory transistors.

FIG. 4 illustrates examples of changes in threshold voltages of memory transistors MT. Incidentally, FIG. 4 includes not only examples of changes in threshold voltages which occur when the controller CTL2 performs the hold time control, but also examples of changes in threshold voltages in a comparative example of the hold time control which occur when stored electric charges are extracted from floating gates FG through the natural discharge. In FIG. 4, each of verify voltages VGwv (VGwv1, VGwv2) used to perform a write control is a voltage to be applied to the control gates of memory transistors MT of the write targets for a verify operation for checking the threshold voltages of the memory transistors MT. In addition, a gate voltage VGr used to perform a read control is a voltage (at +5 V in the example illustrated in FIG. 3) to be applied to the control gates of a memory transistors MT of the read target.

In FIG. 4, each solid line represents a distribution of threshold voltages which are observed after the write control is completed, and each dashed line represents a distribution of threshold voltages which are observed after a lapse of the predetermined hold time Thd since the completion of the write control. Meanwhile, each dotted line represents a distribution of threshold voltages which are observed while the predetermined hold time Thd is elapsing after the completion of the write control.

In the hold time control, stored electric charges are extracted from the floating gates FG in the forced manner. For example, threshold voltages of the memory transistors MT right after the completion of the write control are distributed in a voltage range which is higher than the write control verify voltage VGwv1. Thereafter, the threshold voltages become lower over time. After the predetermined hold time Thd elapses, the threshold voltages are distributed around a voltage which is lower than the read control gate voltage VGr. In the hold time control, the variation in the threshold voltages after the completion of the write control is similar to the variation in the threshold voltages after the lapse of the predetermined hold time Thd.

In the comparative example, stored electric charges are extracted from the floating gates FG by the natural discharge. The amount of electric charges extracted from the floating gates FG per unit time by the natural discharge is less than the amount of electric charges extracted from the floating gates FG per unit time by the hold time control. For this reason, in the comparative example, the write control verify voltage VGwv2 is set at a voltage which is less than the verify voltage VGwv1.

In the comparative example, for example, threshold voltages of the memory transistors MT right after the completion of the write control are distributed in a voltage range which is higher than the write control verify voltage VGwv2. Thereafter, the threshold voltages become lower over time. After the predetermined hold time Thd elapses, the threshold voltages are distributed around a voltage which is lower than the read control gate voltage VGr.

In the comparative example, the amount of electric charges to be extracted from the floating gates FG depends on the natural discharge. For this reason, the variation in the threshold voltages becomes larger over time. As a result, when the predetermined hold time Thd elapses after the completion of the write control, the variation in the threshold voltages in the comparative example is larger than the variation in the threshold voltages which occurs in the case where the stored electric charges are extracted from the floating gate FG by the hold time control.

Meanwhile, in the hold time control, a proportion of the amount of electric charges extracted from each floating gate FG by the natural discharge in the amount of electric charges extracted from the floating gate FG is small. For example, if the number of electric charges naturally discharged per unit time is several to tens while the number of electric charges discharged in the forced manner by the hold time control is thousands, the total number of electric charges extracted from each floating gate FG is equal to the sum of the "several to tens" and the "thousands." For this reason, the influence of the change in the amount of electric charges naturally discharged on the total amount of electric charges extracted from the floating gate FG is smaller in the hold time control than in the comparative example. Accordingly, in the hold time control, the variation in the threshold voltages after the lapse of the predetermined hold time Thd since the completion of the write control becomes smaller than the comparative example.

Figure 5:
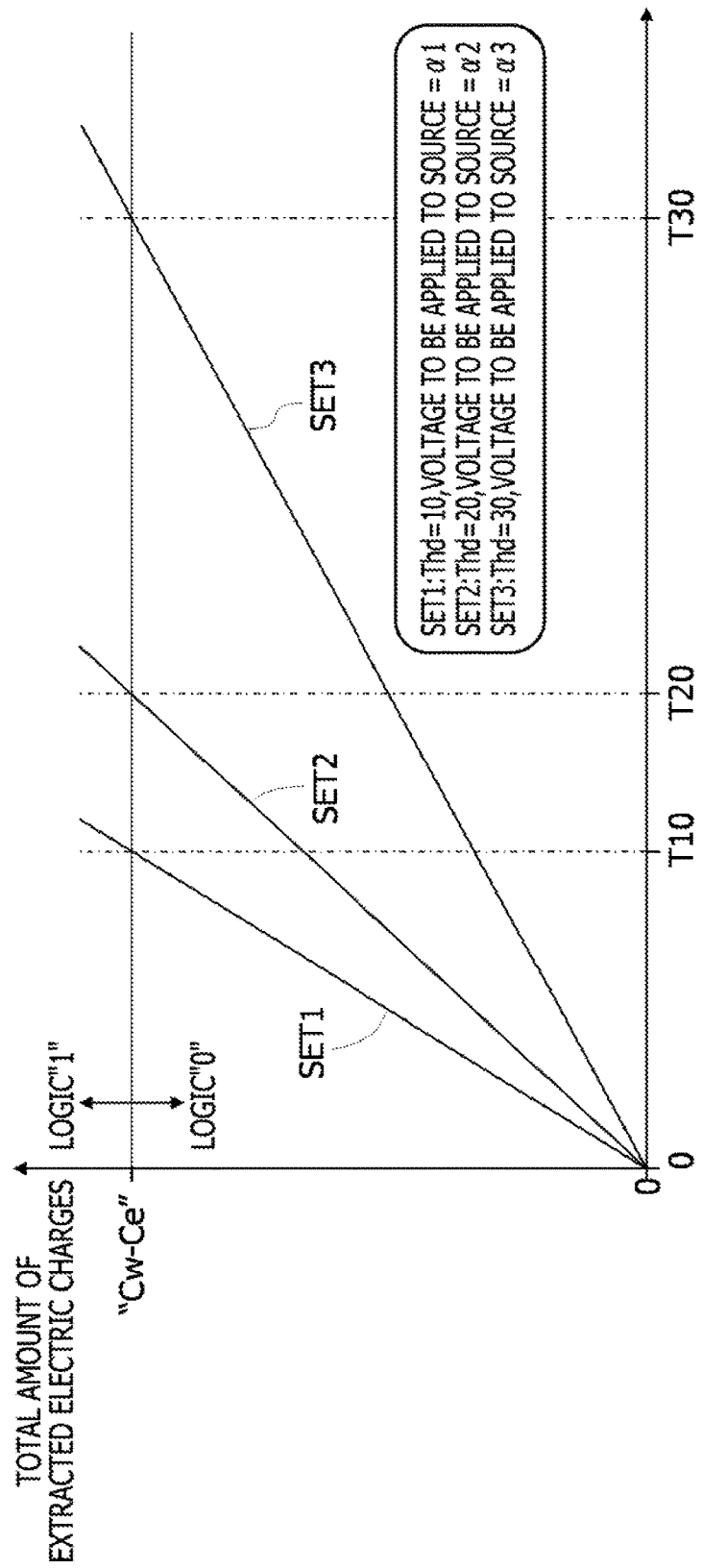
FIG. 5 is a diagram illustrating examples of changes in total amounts of electric charges to be extracted from a floating gate.

FIG. 5 illustrates examples of a change in the total amount of electric charges to be extracted from a floating gate FG. In FIG. 5, the vertical axis represents the total amount of electric charges to be extracted from the floating gate FG (hereinafter referred to as a "total extracted electric charge amount" as well), and the horizontal axis represents how long a time has passed since the start of the hold time control. The meanings of the electric charge amounts Cw, Ce are the same as those of the electric charge amounts Cw, Ce discussed in FIG. 1. For example, the electric charge amount Cw represents the amount of electric charges which are stored in the floating gate FG when the write control is completed, and the electric charge amount Ce represents the amount of electric charges which are stored in the floating gate FG when the threshold voltage of the memory transistor MT becomes lower than the read control gate voltage. Accordingly, when the total extracted electric charge amount reaches the electric charge amount (Cw−Ce) representing the differential between the electric charge amount Cw and the electric charge amount Ce, the data is erased.

A setting SET1 represents a relationship between the total extracted electric charge amount and the lapse of time which is observed in a case where the data hold time Thd is set at a time T10. In the setting SET1, the hold time control source voltage is set at +α1 V in order that electric charges are extracted from the floating gate FG by the electric charge amount (Cw−Ce) in the time T10 at a per-unit-time rate of (Cw−Ce)/T10. Incidentally, +α1 V is a voltage which is less than the erase source voltage (at +12 V in the example illustrated in FIG. 3). Accordingly, in the setting SET1, electric charges are extracted from the floating gate FG at the per-unit-time rate of (Cw−Ce)/Thd, and the total extracted electric charge amount reaches the electric charge amount (Cw−Ce) when the time T10 elapses.

A setting SET2 represents a relationship between the total extracted electric charge amount and the lapse of time which is observed in a case where the data hold time Thd is set at a time T20 which is longer than the time 10. In the setting SET2, the hold time control source voltage is set at +α2 V in order that electric charges are extracted from the floating gate FG by the electric charge amount (Cw−Ce) in the time T20 at a per-unit-time rate of (Cw−Ce)/T20. Incidentally, +α2 V is a voltage which is less than +α1 V. Accordingly, in the setting SET2, electric charges are extracted from the floating gate FG at the per-unit-time rate of (Cw−Ce)/T20, and the total extracted electric charge amount reaches the electric charge amount (Cw−Ce) when the time T20 elapses.

A setting SET3 represents a relationship between the total extracted electric charge amount and the lapse of time which is observed in a case where the data hold time Thd is set at a time T30 which is longer than the time 20. In the setting SET3, the hold time control source voltage is set at +α3 V in order that electric charges are extracted from the floating gate FG by the electric charge amount (Cw−Ce) in the time T30 at a per-unit-time rate of (Cw−Ce)/T30. Incidentally, +α3 V is a voltage which is less than +α2 V. Accordingly, in the setting SET3, electric charges are extracted from the floating gate FG at the per-unit-time rate of (Cw−Ce)/T30, and the total extracted electric charge amount reaches the electric charge amount (Cw−Ce) when the time T30 elapses.

As described above, the controller CTL2 sets values of the voltages to be applied to the control gate CG, the source SC and the drain DR of the memory transistor MT when performing the hold time control. In other words, the memory MEM2 is capable of controlling the data hold time Thd by changing the value (+α V) of the hold time control source voltage. Accordingly, an electronic device may achieve part of the security function by use of the hold time control by the memory MEM2.

Figure 6:
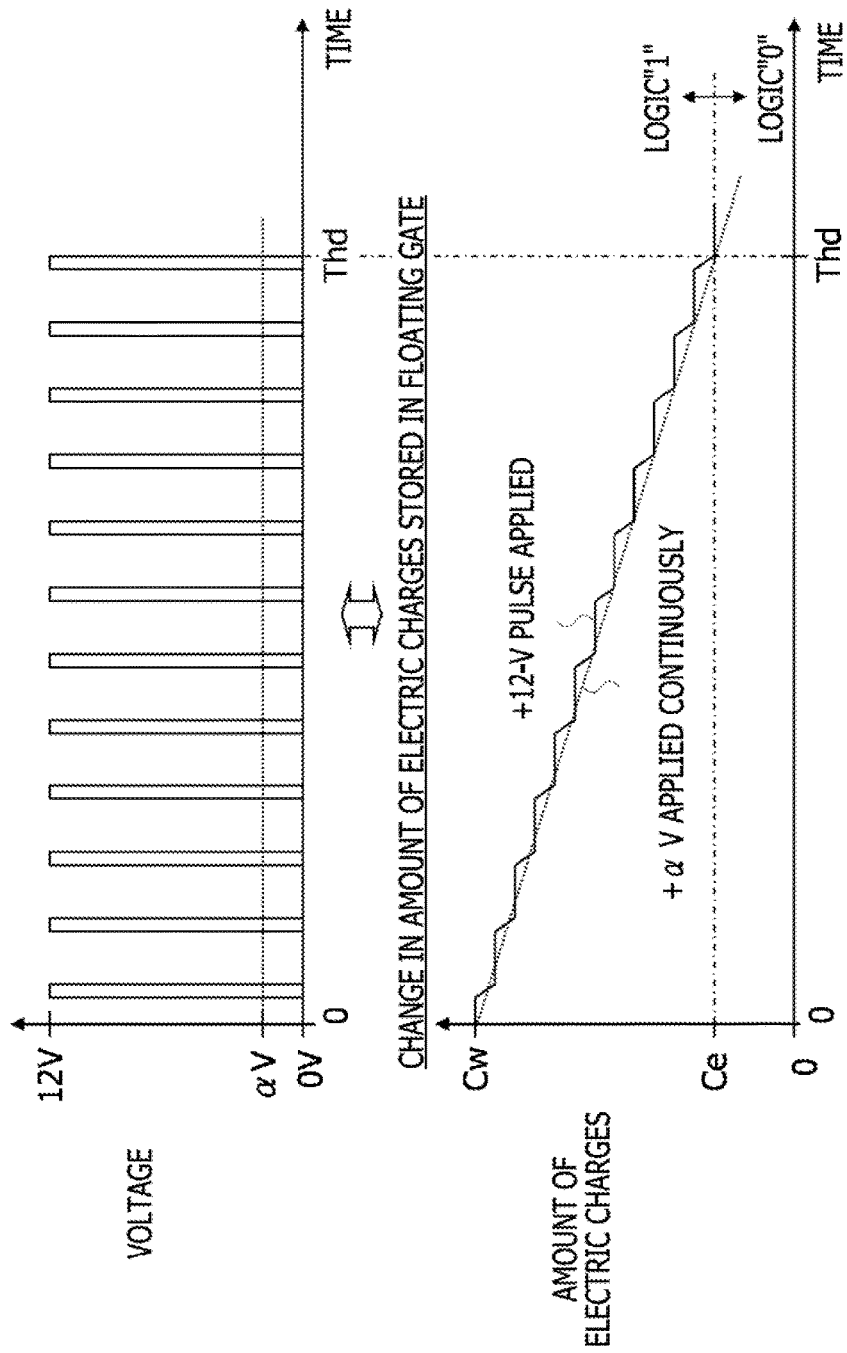
FIG. 6 is a diagram illustrating another example of the voltage control to be performed through a hold time control.

FIG. 6 illustrates another example of the voltage control to be performed through the hold time control. Incidentally, FIG. 6 includes not only the example of the control of the hold time control source voltage, but also an example of a change in the amount of electric charges to be stored in the floating gate FG. In the diagram illustrating the control of the hold time control source voltage, the vertical axis represents a voltage to be applied to the source SC of the memory transistor MT, and the horizontal axis represents how long a time has elapsed since the start of the hold time control. In addition, in the diagram illustrating the change in the amount of electric charges to be stored in the floating gate FG, the vertical axis represents the amount of electric charges to be stored in the floating gate FG, and the horizontal axis represents how long a time has elapsed since the start of the hold time control. The meanings of the electric charge amounts Cw, Ce are the same as those of the electric charge amounts Cw, Ce discussed in FIG. 1. In the diagram, the dotted line represents a change in the amount of electric charges which are stored in the floating gate FG while +α V as the hold time control source voltage is continuously applied to the source SC of the memory transistor MT.

In the example illustrated in FIG. 6, the controller CTL2 applies a pulse with a high level of +12 V, which is equal to the erase source voltage, to the source SC of the memory transistor MT. In this case, the electric charges stored in the floating gate FG are discharged while the +12-V pulse is applied to the source SC of the memory transistor MT. Incidentally, the pulse width, the pulse application interval and the like are set in order that the amount of electric charges stored in the floating gate FG becomes equal to the electric charge amount Ce when the hold time Thd elapses after the start of the hold time control. Thus, the amount of electric charges stored in the floating gate FG decreases each time the pulse is applied to the source SC of the memory transistor MT, and becomes equal to the electric charge amount Ce when the hold time Thd elapses after the start of the hold time control.

Figure 7:
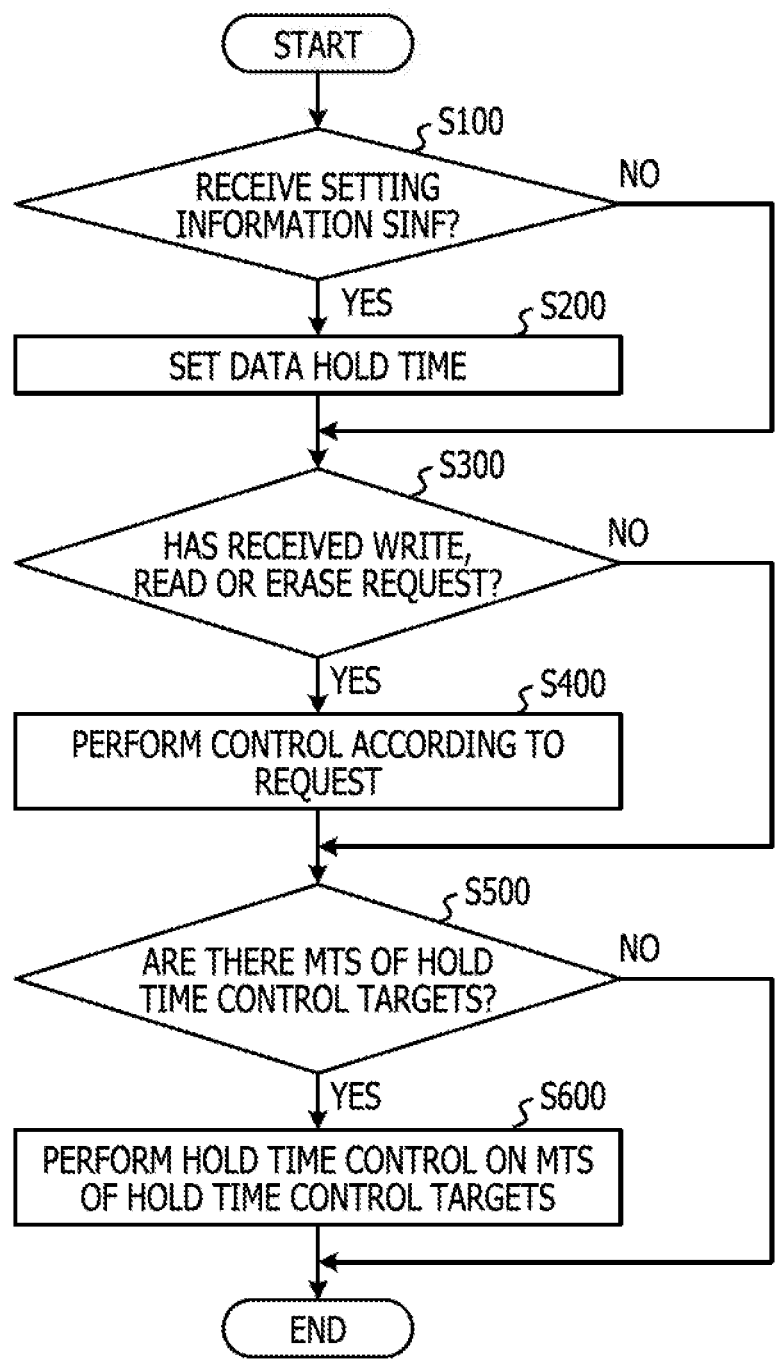
FIG. 7 is a diagram illustrating an example of an operation of the memory illustrated in FIG. 2.

FIG. 7 illustrates an example of the operation of the memory MEM2 illustrated in FIG. 2.

In step S100, the controller CTL2 determines whether the controller CTL2 has received the setting information SINF about the setting of the data hold time. In a case where the controller CTL2 has received the setting information SINF, the operation of the memory MEM2 proceeds to step S200. On the other hand, in a case where the controller CTL2 has received no setting information SINF, the operation of the memory MEM2 proceeds to step S300.

In step S200, the controller CTL2 sets the data hold time at the predetermined hold time Thd based on the setting information SINF received in step S100. After the execution of the process in step S200, the operation of the memory MEM2 proceeds to step S300.

In step S300, the controller CTL2 determines whether the controller CTL2 has received a write, read or erase request. In a case where the controller CTL2 has received a write, read or erase request, the operation of the memory MEM2 proceeds to step S400. On the other hand, in a case where the controller CTL2 has received no write, read or erase request, the operation of the memory MEM2 proceeds to step S500.

In step S400, the controller CTL2 performs the control according to the request received in step S300 (namely, the write control, the read control and the erase control). For example, in a case where the controller CTL2 has received a write request in step S300, the controller CTL2 performs the write control to write data to memory cells MC of the write targets. After the execution of the process in step 400, the operation of the memory MEM2 proceeds to step S500.

In step S500, the controller CTL2 determines whether there are memory transistors MT of the hold time control targets. In a case where there are memory transistors MT of the hold time control targets, the operation of the memory MEM2 proceeds to step S600. On the other hand, in a case where there are no memory transistors MT of the hold time control targets, the memory MEM2 enters and stays in the standby mode while terminating the operation.

In step S600, the controller CTL2 performs the hold time control on the memory transistors MT of the hold time control targets. For example, the controller CTL2 applies 0 V and +α V, respectively, to the control gates CG and the sources SC of the memory transistors MT of the hold time control targets, and puts the drains DR of the memory transistors MT of the hold time control targets in the floating state. Otherwise, the controller CTL2 may apply the +12-V pulse, instead of continuously applying +α V, to the sources SC of the memory transistors MT of the hold time control targets. Incidentally, the controller CTL2 applies 0 V to the word lines WL, the bit lines BL and the source lines SL which are not connected to the memory transistors MT of the hold time control targets, as discussed using FIG. 3.

As discussed above, in the case where the controller CTL2 has received the write request, the controller CTL2 writes the data to the memory cells MC. Thereafter, by controlling the voltages to be applied to the memory transistors MT, the controller CTL2 performs the hold time control on each memory cell MC in a column of the memory cells in which the data hold time is set at the predetermined hold time Thd.

In the operation illustrated in FIG. 7, the controller CTL2 performs the hold time control on each memory cell MC in the column of the memory cells in which the data hold time is set at the predetermined hold time Thd, regardless of whether the data is written to the memory cells MC. Thereby, once the data write is completed, forced discharge by the hold time control is started. In addition, once the controller CTL2 starts to perform the hold time control in step S600, forced discharge is started in the memory cells MC to which the data is written before the hold time control.

Meanwhile, the operation of the memory MEM2 is not limited to the example illustrated in FIG. 7. For example, the controller CTL2 may suspends the execution of the hold time control until the controller CTL2 completes writing the data to specific memory cells MC in the column of the memory cells in which the data hold time is set at the predetermined hold time Thd. In other words, the controller CTL2 may starts the hold time control only after completing the data write.

As described above, the embodiment discussed using FIGS. 2 to 7 is capable of bringing about the same effect as does the embodiment discussed using FIG. 1. For example, in the case where the controller CTL2 has received the write request, the controller CTL2 writes the data to a corresponding memory cell MC by storing electric charges in the floating gate FG of the memory transistor MT included in the memory cell MC. Furthermore, by controlling the voltages to be applied to the memory transistor MT, the controller CTL2 performs the hold time control for extracting the stored electric charges from the floating gate FG until the amount of electric charges stored in the floating gate FG decreased to the electric charge amount Ce corresponding to the state where the data is erased from the memory cell MC. Thereby, the embodiment is capable of reducing the variation in the hold time compared with the control method depending on the natural discharge. In other words, the embodiment is capable of controlling the data hold time accurately.

Furthermore, the controller CTL2 sets the data hold time at the predetermined hold time Thd in the specific ones of the multiple memory cells MC, and performs the hold time control on the memory cells MC in which the data hold time is set at the predetermined hold time Thd. Thereby, depending on what purpose or the like the memory MEM2 serves, the memory MEM2 is capable of changing the ratio between the memory cells MC in which the data hold time is set at the predetermined hold time Thd and the memory cells MC in which the data hold time is not set at the predetermined hold time Thd.

Figure 8:
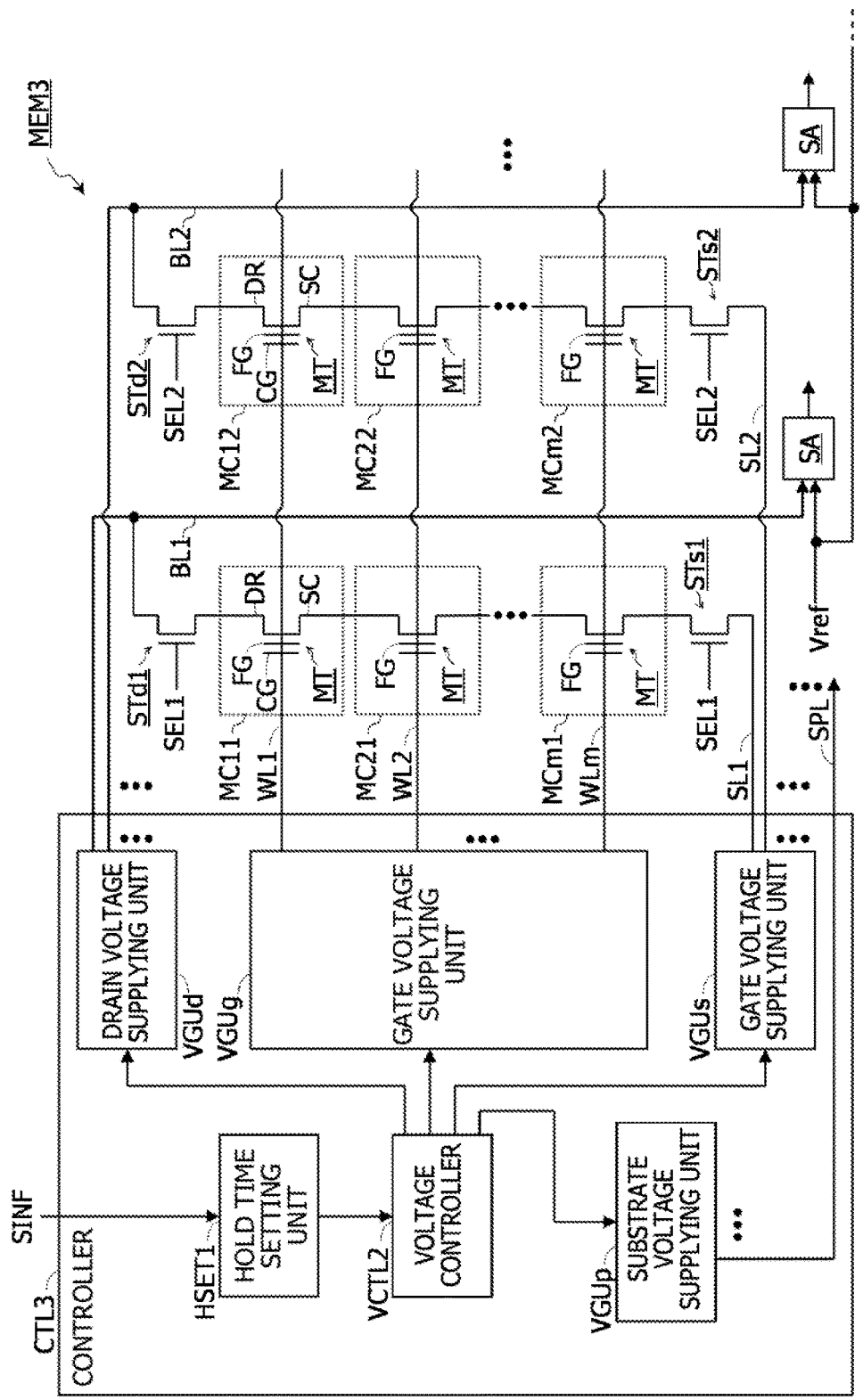
FIG. 8 is a diagram illustrating a memory and a memory control method of another embodiment.

FIG. 8 illustrates a memory and a memory control method of another embodiment. Components which are the same as or similar to those discussed using FIGS. 1 to 7 will be denoted by the same or similar reference signs, and detailed descriptions for such components will be omitted. A memory MEM3 illustrated in FIG. 8 is a NAND flash memory, and includes a controller CTL3 instead of the controller CTL2 illustrated in FIG. 2. The rest of the configuration and operation of the memory MEM3 is the same as or similar to that of the configuration and operation of the memory MEM2 illustrated in FIG. 2. For example, the operation of the memory MEM3 is similar to the operation illustrated in FIG. 7. Incidentally, the illustration in FIG. 8 omits reference signs denoting the sources SC, the control gates CG and the drains DR of the memory transistors MT included in the memory cells MC12, MC21, MC22 for the purpose of making the drawing easy to look at.

For example, the memory MEM3 includes: multiple non-volatile memory cells MC (MC11, MC12, MC21, MC22, . . . ) arrayed in a matrix layout; the controller CTL3; and multiple sense amplifiers SA. The memory MEM3 further includes selection transistors STd (STd1, STd2, . . . ), STs (STs1, STs2, . . . ) arranged in the respective columns of the memory cells MC.

The selection transistors ST (STd, STs) are, for example, n-channel MOS transistors for selecting a column including memory cells of write or other process targets. For example, the selection transistors ST establish an electrical conduction between the drains and the sources when selection signals SEL (SEL1, SEL2, . . . ) are at high level, and cancel the electrical condition between the drains and the sources when the selection signals SEL are at low level. The illustration in FIG. 8 omits parts of the signal lines for transmitting the selection signals SEL for the purpose of making the drawing easy to look at. For example, the selection signals SEL are supplied from the gate voltage supplying unit VGUg of the controller CTL3 to the gates of the selection transistors ST.

Descriptions will be hereinbelow provided for a connection relationship the selection transistors ST and the memory cells MC which are arranged in the first column. Incidentally, the connection relationship between the selection transistors ST and the memory cells MC which are arranged in each of the other columns is similar to the connection relationship the selection transistors ST and the memory cells MC which are arranged in the first column.

The drain of the selection transistor STd1 is connected to the bit line BL1, and the source of the selection transistor STd1 is connected to the drain DR of the memory transistor in the memory cell MC11. The selection transistor STd1 receives the selection signal SEL1 via the gate. The drain of the selection transistor STs1 is connected to the source SC of the memory transistor in a memory cell MCm1, and the source of the selection transistor STs1 is connected to the source line SL. The selection transistor STs1 receives the selection signal SEL1 via the gate. Incidentally, each memory cell MCm (MCm1, MCm2, . . . ) is a memory cell disposed in the m-th row which is the last row.

Each memory cell MC includes the memory transistor MT in which electric charges are stored in the floating gate FG when data is written to the memory cell MC. In the example illustrated in FIG. 8, the memory transistors MT use an n-channel MOS transistor. The control gates CG of the memory transistors MT in the memory cells MC arrange in the same row are connected to a common word line WL. The memory transistors MT in the memory cells MC arranged in the same column are connected in series between the selection transistors STd, STs. For example, the source SC of the memory transistor MT in the memory cell MC disposed in the i-th row (where i is an integer equal to or greater than 1, but less than m) is connected to the drain DR of the memory transistor MT in the memory cell MC disposed in the (i+1)-th row.

The sense amplifiers SA are the same as or similar to the sense amplifiers SA illustrated in FIG. 2. For example, the sense amplifiers SA are provided to the respective columns of the memory cells MC arrayed in the matrix layout, and each sense amplifier SA is connected to the bit line BL in the corresponding column.

The controller CTL3 performs the write control, the erase control, the read control and the hold time control. Incidentally, unlike the controller CTL2 illustrated in FIG. 2, the controller CTL3 further includes a substrate voltage supplying unit VGUp configured to supply substrate voltages to semiconductor substrates SUB of the memory transistors MT via substrate power supply lines SPL. For this reason, the controller CTL3 includes a voltage controller CTL2 instead of the voltage controller CTL2 illustrated in FIG. 2. The rest of the configuration of the controller CTL3 is the same as or similar to that of the configuration of the voltage controller CTL2 illustrated in FIG. 2. For example, the controller CTL3 includes the hold time setting unit HSET1, the voltage controller VCTL2, the drain voltage supplying unit VGUd, the gate voltage supplying unit VGUg, the source voltage supplying unit VGUs, and the substrate voltage supplying unit VGUp. The substrate voltage supplying unit VGUp will be hereinafter referred to as a "voltage supplying unit VGUp" of a "voltage supplying unit VGU" as well.

The hold time setting unit HSET1 is the same as or similar to the hold time setting unit HSET1 illustrated in FIG. 2.

The voltage controller VCTL2 applies voltages to the bit lines BL, the word lines WL, the source lines SL, and the substrate power supply lines SPL by controlling the voltage supplying units VGUd, VGUg, VGUs, VCUp. For example, the voltage controller VCTL2 controls the voltage supplying units VGU such that voltages illustrated in FIG. 9 are applied to the bit lines BL, the word lines WL, the source lines SL, and the substrate power supply lines SPL depending on the write control, the read control, the erase control, and the standby mode.

The drain voltage supplying unit VGUd generates the read drain voltage, the erase drain voltage, the hold time control drain voltage and the like, and applies the drain voltages suitable for each control to the bit lines BL. Thereby, the drain voltages suitable for each control are applied to the drains DR of the memory transistors MT.

The gate voltage supplying unit VGUg generates the write gate voltage, the read gate voltage and the like, and applies the gate voltages suitable for each control to the word lines WL. Thereby, the gate voltages suitable for each control are applied to the control gates CG of the memory transistors MT.

The source voltage supplying unit VGUs generates the erase source voltage, the hold time control source voltage and the like, and applies the source voltages suitable for each control to the source lines SL. Thereby, the source voltages suitable for each control are applied to the sources SC of the memory transistors MT.

The substrate voltage supplying unit VGUp generates an erase substrate voltage, a hold time control substrate voltage and the like, and applies the substrate voltages suitable for each control to the substrate power supply lines SPL. Thereby, the substrate voltages suitable for each control are applied to the semiconductor substrates SUB of the memory transistors MT.

Meanwhile, the hold time control drain, source and substrate voltages are generated such that the hold time control drain, source and substrate voltages become equal to voltage values corresponding to the data hold time.

The configuration of the memory MEM3 is not limited to the example illustrated in FIG. 8. For example, either of the selection transistors STd or the selection transistors STs may be omitted from the configuration of the memory MEM3. Furthermore, each memory transistor MT may use a p-channel MOS transistor. In this case, the polarities of the voltages to be applied to the memory transistor MT are reverse to the polarities of the voltages to be applied to the memory transistor MT using the n-channel MOS transistor (for example, the voltages illustrated in FIG. 9). Moreover, each selection transistor ST may use a p-channel MOS transistor.

FIG. 9 illustrates examples of the voltages to be supplied to the word lines WL, the bit lines BL, the source lines SL and the substrate power supply lines SPL which are illustrated in FIG. 8. Incidentally, the voltages to be supplied to the word lines WL and the like for the write control, which are discussed in FIG. 9, are voltages for injecting electric charges into the floating gates FG through the tunnel effect in the sequence for the write control. In addition, the selection transistors ST in columns including the memory transistors MT of each control targets are set in an electrically-conductive state, and the selection transistors ST in the other columns are set in an electrically-nonconductive state.

In the write control (electrical charge injection), the voltage supplying unit VGUg supplies a +20-V voltage to the word lines WL connected to memory transistors MT of the write targets. Thereby, the +20-V voltage is applied to the control gates CG of the memory transistors MT of the write targets. Meanwhile, the voltage supplying units VGUd, VGUs, VGUp supply a 0-V voltage to the bit lines BL, the source lines SL and the substrate power supply lines SPL connected to the memory transistors MT of the write targets. Thereby, the 0-V voltage is applied to the drains DR, the sources SC and the semiconductor substrates SUB of the memory transistors MT of the write targets. Incidentally, a voltage control which is the same as performed for the standby mode is performed on the word lines WL, the bit lines BL, the source lines SL and the substrate power supply lines SPL which are not connected to the memory transistors MT of the write targets.

In the read control, the voltage supplying unit VGUg supplies a 0-V voltage to the word lines WL connected to memory transistors MT of the read targets, and supplies a +5-V voltage to the other word lines WL. Thereby, the 0-V voltage is applied to the control gates CG of the memory transistors MT of the read targets, and the +5-V voltage is applied to the control gates CG of the memory transistors MT which are not the read targets. Meanwhile, the voltage supplying units VGUd, VGUs, VGUp supply voltages of +1 V, 0-V, and 0 V, respectively, to the bit lines BL, the source lines SL and the substrate power supply lines SPL connected to the memory transistors MT of the read targets. Thereby, for example, in a case where no data is written to the memory transistors MT of the read targets, an electric current flows between the bit lines BL and the source lines SL, and the logic "1" is accordingly read. On the other hand, in a case where data is written to the memory transistors MT of the read targets, no electric current flows between the bit lines BL and the source lines SL, and the logic "0" is accordingly read. Incidentally, the voltage control which is the same as performed for the standby mode is performed on the bit lines BL, the source lines SL and the substrate power supply lines SPL which are not connected to the memory transistors MT of the read targets.

In the erase control, the voltage supplying unit VGUg supplies a 0-V voltage to the word lines WL connected to memory transistors MT of the erase targets. Thereby, the 0-V voltage is applied to the control gates CG of the memory transistors MT of the erase targets. Meanwhile, the voltage supplying units VGUd, VGUs, VGUp supply a +20-V voltage to the bit lines BL, the source lines SL and the substrate power supply lines SPL connected to the memory transistors MT of the erase targets. Thereby, the +20-V voltage is applied to the drains DR, the sources SC and the semiconductor substrates SUB of the memory transistors MT of the erase targets. Incidentally, the voltage control which is the same as performed for the standby mode is performed on the word lines WL, the bit lines BL, the source lines SL and the substrate power supply lines SPL which are not connected to the memory transistors MT of the erase targets.

When in the standby mode, the controller CTL3 performs voltage controls which are different from the memory cells MC in which the data hold time is set at the predetermined hold time Thd and the memory cells MC in which the data hold time is not set at the predetermined hold time Thd. In FIG. 9, the column "No Hold Time Control" represents the voltage control to be performed on the memory cells MC in which the data hold time is not set at the predetermined hold time Thd. For example, in the hold time control, the voltage supplying units VGUg, VGUd, VGUs, VGUp supply a 0-V voltage to the word lines WL, the bit lines BL and the source lines SL and the substrate power supply lines SPL.

Meanwhile, in the hold time control, the voltage supplying unit VGUg supplies a 0-V voltage to the word lines WL connected to memory transistors MT of the hold time control targets. Thereby, the 0-V voltage is applied to the control gates CG of the memory transistors MT of the hold time control targets. Meanwhile, the voltage supplying units VGUd, VGUs, VGUp supply a +α-V voltage to the bit lines BL, the source lines SL and the substrate power supply lines SPL connected to the memory transistors MT of the hold time control targets. Thereby, the +α-V voltage is applied to the drains DR, the sources SC and the semiconductor substrate SUB of the memory transistors MT of the hold time control targets. In this respect, the +α-V voltage is a voltage value which is calculated depending on the hold time, and which is less than the +20-V voltage to be applied to the sources SC of the memory transistors MT of the erase targets.

Incidentally, the voltage control which is the same as performed while the hold time control is not performed is performed on the word lines WL, the bit lines BL, the source lines SL and the substrate power supply lines SPL which are not connected to the memory transistors MT of the hold time control targets.

Moreover, the voltages to be supplied to the word lines WL, the bit lines BL, the source lines SL and the substrate power supply lines SPL for each control are not limited to the examples illustrated in FIG. 9. For example, a voltage greater than 0 V may be applied to the control gates CG of the memory transistors MT of the hold time control targets. In this case, a voltage for making the potential difference between the sources SC and the control gates CG, the potential difference between the drains DR and the control gates CG, as well as the potential difference between the semiconductor substrates SUB and the control gates CG become equal to +α V is applied to the bit lines BL, the source lines SL and the substrate power supply lines SPL which are connected to the memory transistors MT of the hold time control targets. Otherwise, the controller CTL3 may apply a +20-V pulse, instead of continuously applying +α V, to the bit lines BL, the source lines SL and the substrate power supply lines SPL which are connected to the memory transistors MT of the hold time control targets.

As described above, the embodiment discussed using FIGS. 8 and 9 is capable of bringing about the same effect as does the embodiment discussed using FIGS. 2 to 7. For example, the embodiment is capable of reducing the variation in the hold time compared with the control method depending on the natural discharge. In other words, the embodiment is capable of controlling the data hold time accurately. Furthermore, depending on what purpose or the like the memory MEM3 serves, the embodiment is capable of changing the ratio between the memory cells MC in which the data hold time is set at the predetermined hold time Thd and the memory cells MC in which the data hold time is not set at the predetermined hold time Thd.

Figure 10:
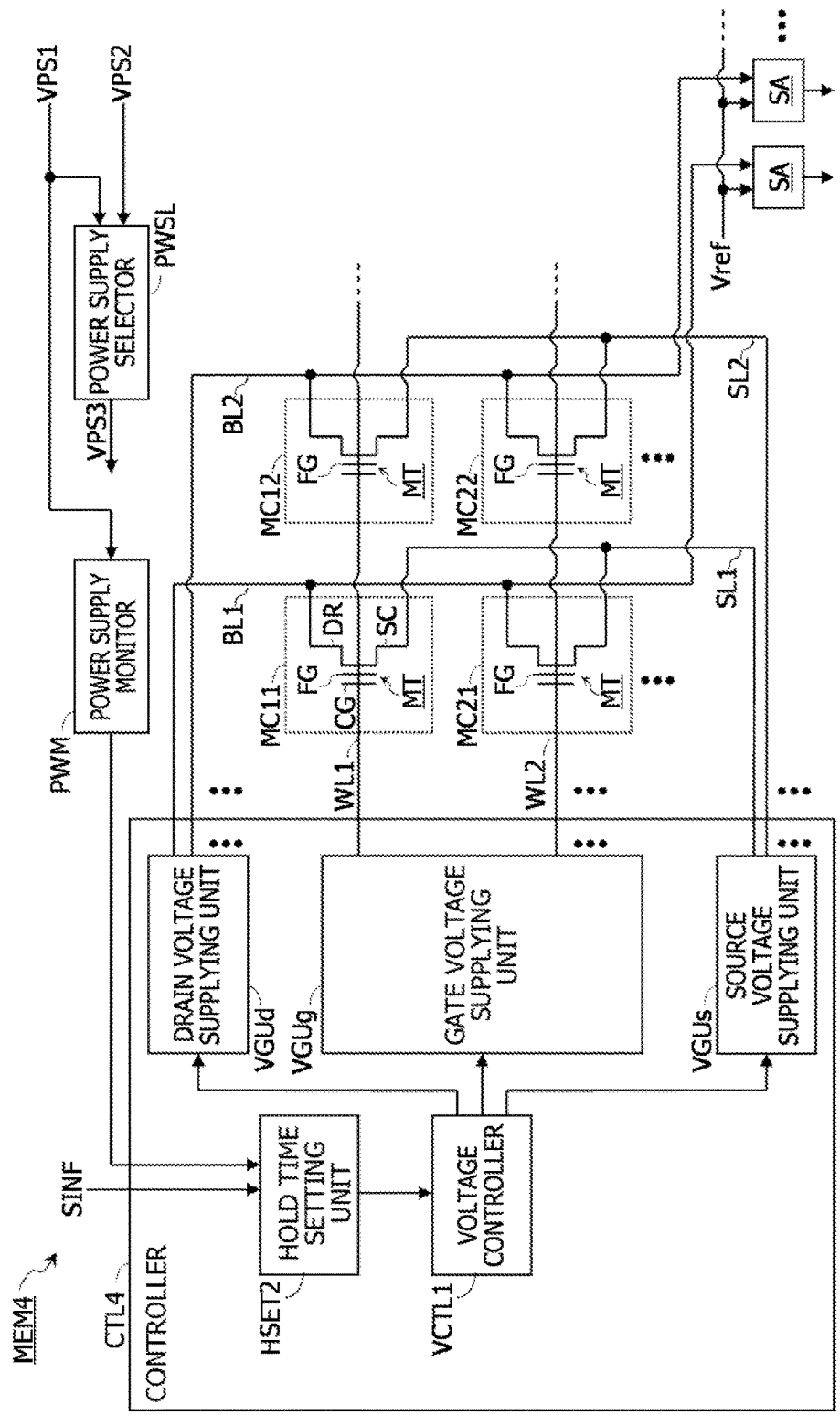
FIG. 10 is a diagram illustrating a memory and a memory control method of yet another embodiment.

FIG. 10 illustrates a memory and a memory control method of yet another embodiment. Components which are the same as or similar to those discussed using FIGS. 1 to 9 will be denoted by the same or similar reference signs, and detailed descriptions for such components will be omitted. A memory MEM4 illustrated in FIG. 10 includes a controller CTL4 instead of the controller CTL2 illustrated in FIG. 2. Unlike the memory MEM2 illustrated in FIG. 2, the memory MEM4 further includes a power supply monitor PWM and a power supply selector PWSL. The rest of the configuration of the memory MEM4 is the same as or similar to that of the configuration of the memory MEM2 illustrated in FIG. 2. Incidentally, the illustration in FIG. 10 omits reference signs denoting the sources SC, the control gates CG and the drains DR of the memory transistors MT included in the memory cells MC12, MC21, MC22 for the purpose of making the drawing easy to look at.

For example, the memory MEM4 includes: multiple non-volatile memory cells MC (MC11, MC12, MC21, MC22, . . . ) arrayed in a matrix layout; the controller CTL4; multiple sense amplifiers SA; the power supply monitor PWM; and the power supply selector PWSL. The memory cells MC and the sense amplifiers SA are the same as or similar to those illustrated in FIG. 2.

The power supply selector PWSL receives: a first power supply voltage VPS1 supplied from a power supply circuit or the like of an electronic device in which the memory MEM4 is mounted; and a second power supply voltage VPS2 supplied from a battery or the like. The power supply selector PWSL selects either the first power supply voltage VPS1 or the second power supply voltage VPS2 as an internal power supply voltage VPS3. For example, the power supply selector PWSL selects the first power supply voltage VPS1 as the internal power supply voltage VPS3 while the first power supply voltage VPS1 is supplied, and selects the second power supply voltage VPS2 as the internal power supply voltage VPS3 while the supply of the first power supply voltage VPS1 stops. The power supply selector PWSL supplies the internal power supply voltage VPS3 to the voltage supplying units VGU and the like. Incidentally, while the supply of the first power supply voltage VPS1 stops, the power supply selector PWSL may supply the internal power supply voltage VPS3 to only a limited block which is designed to operate when the hold time control is performed.

The power supply monitor PWM determines whether the supply of the first power supply voltage VPS1 stops, and notifies a result of the determination to a hold time setting unit HSET2. Incidentally, the power supply monitor PWM may be configured to determine that the supply of the first power supply voltage VPS1 does not stop in a case where the supply of the first power supply voltage VPS1 stops only for a split second but resumes within a predetermined length of time. In other words, the power supply monitor PWM may be configured to determine that the supply of the first power supply voltage VPS1 stops in a case where the supply of the first power supply voltage VPS1 stops longer than the predetermined length of time.

The controller CTL4 starts to perform the hold time control once the supply of the first power supply voltage VPS1 stops. Incidentally, the controller CTL4 is the same as or similar to the controller CTL2 illustrated in FIG. 2, except that the controller CTL4 includes the hold time setting unit HSET2 instead of the hold time setting unit HSET1 illustrated in FIG. 2. For example, the controller CTL4 includes the hold time setting unit HSET2, the voltage controller VCTL1, the drain voltage supplying unit VGUd, the gate voltage supplying unit VGUg and the source voltage supplying unit VGUs.

The hold time setting unit HSET2 is the same as or similar to the hold time setting unit HSET1 illustrated in FIG. 2, except that the hold time setting unit HSET2 receives from the power supply monitor PWM the information about whether the supply of the first power supply voltage VPS1 stops. For example, the hold time setting unit HSET2 receives the setting information SINF about the setting of the data hold time from the outside of the memory MEM4, and sets the data hold time at the predetermined hold time Thd based on the setting information SINF. Furthermore, when the hold time setting unit HSET2 receives from the power supply monitor PWM the information that the supply of the first power supply voltage VPS1 stops, the hold time setting unit HSET2 notifies a result of setting the data hold time to the voltage controller VCTL1.

The voltage controller VCTL1 is the same as or similar to the voltage controller VCTL1 illustrated in FIG. 2. For example, when the voltage controller VCTL1 receives the result of setting the data hold time from the hold time setting unit HSET2, the voltage controller VCTL1 starts to perform the hold time control by controlling the voltage supplying units VGUd, VGUg, VGUs.

The voltage supplying units VGUd, VGUg, VGUs are the same as or similar to the voltage supplying units VGUd, VGUg, VGUs illustrated in FIG. 2. As described above, the controller CTL4 starts to perform the hold time control once the supply of the first power supply voltage VPS1 stops. Incidentally, the configuration of the memory MEM4 is not limited to the example illustrated in FIG. 10. For example, the power supply monitor PWM and the power supply selector PWSL may be added to the memory MEM3 illustrated in FIG. 8. In this case, the controller CTL3 illustrated in FIG. 8 includes the hold time setting unit HSET2 instead of the hold time setting unit HSET1.

Figure 11:
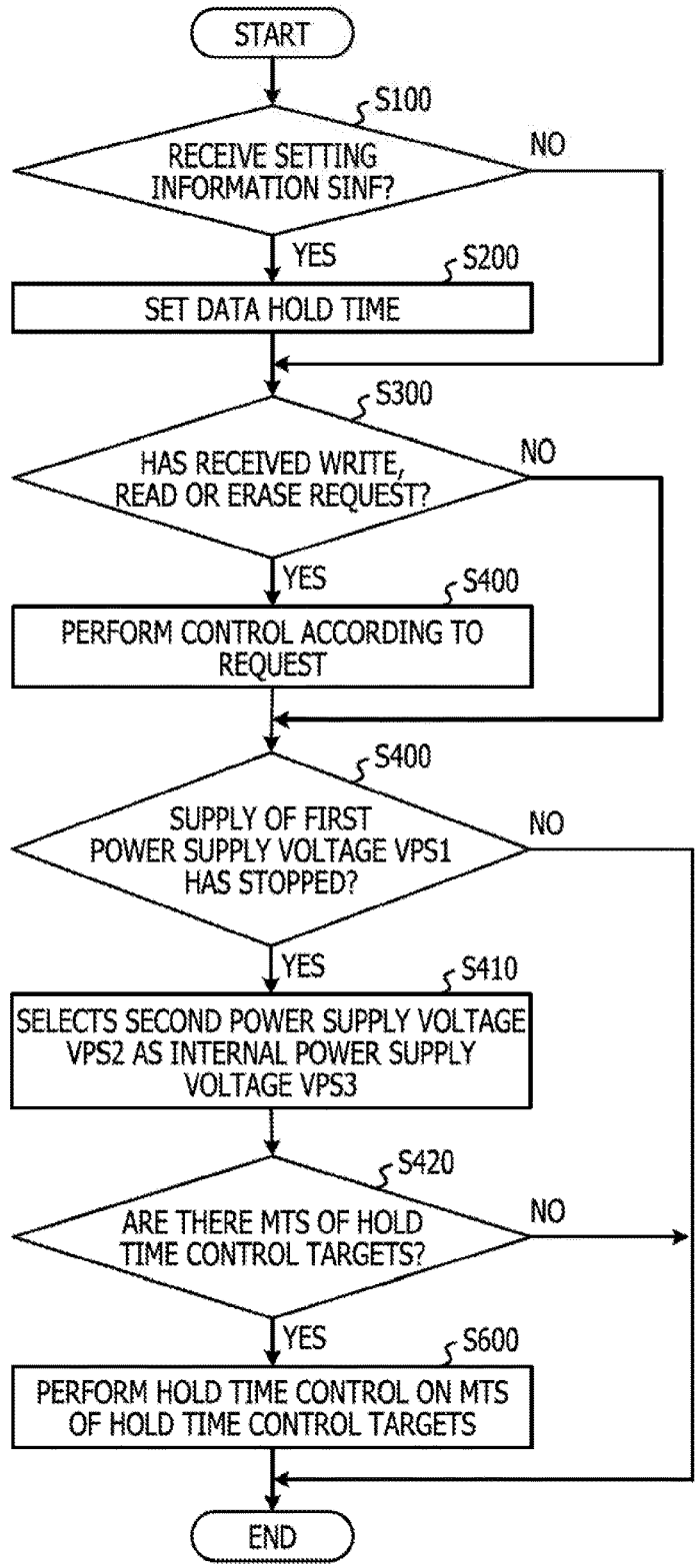
FIG. 11 is a diagram illustrating an example of an operation of the memory illustrated in FIG. 10.

FIG. 11 illustrates an example of the operation of the memory MEM4 illustrated in FIG. 10. The operation discussed using FIG. 11 is the same as or similar to the operation discussed using FIG. 7, except that steps S410, S420 are added to the operation discussed using FIG. 7. The steps which are the same as or similar to the steps discussed using FIG. 7 will be denoted by the same or similar reference signs, and detailed descriptions for such steps will be omitted.

Steps S100 to S400 are the same as or similar to steps S100 to S400 discussed using FIG. 7. The process in step S410 is performed after the process in step S400. Otherwise, in a case where the controller CTL4 determines in step S300 that the controller CTL4 has received no write, read or erase request, the controller CTL4 executes the process in step S410. In other words, in the case where the controller CTL4 determines in step S300 that the controller CTL4 has received no write, read or erase request, the operation of the memory MEM4 proceeds to step S410.

In step S410, the power supply monitor PWM determines whether the supply of the first power supply voltage VPS1 has stopped. In the case where the supply of the first power supply voltage VPS1 has stopped, the operation of the memory MEM4 proceeds to step S420. On the other hand, in a case where the supply of the first power supply voltage VPS1 continues, the memory MEM4 enters and stays at the standby mode while terminating the operation.

In step S420, the power supply selector PWSL selects the second power supply voltage VPS1 as the internal power supply voltage VPS3. For example, as the internal power supply voltage VPS3, the second power supply voltage VPS1 is supplied by the power supply selector PWSL to the voltage supplying units VGU and the like. After the process in step S420, the operation of the memory MEM4 proceeds to step S500. In other words, the processes in steps S500, S600 are executed when the supply of the first power supply voltage VPS1 stops.

Steps S500, S600 are the same as or similar to steps S500, S600 discussed using FIG. 7. For example, in step S600, the controller CTL4 performs the hold time control on the memory transistors MT of the hold time control targets. In other words, in the operation illustrated in FIG. 11, the controller CTL4 starts to perform the hold time control when the supply of the first power supply voltage VPS1 stops. Incidentally, the operation of the memory transistors MT is not limited to the example illustrated in FIG. 11.

Figure 12:
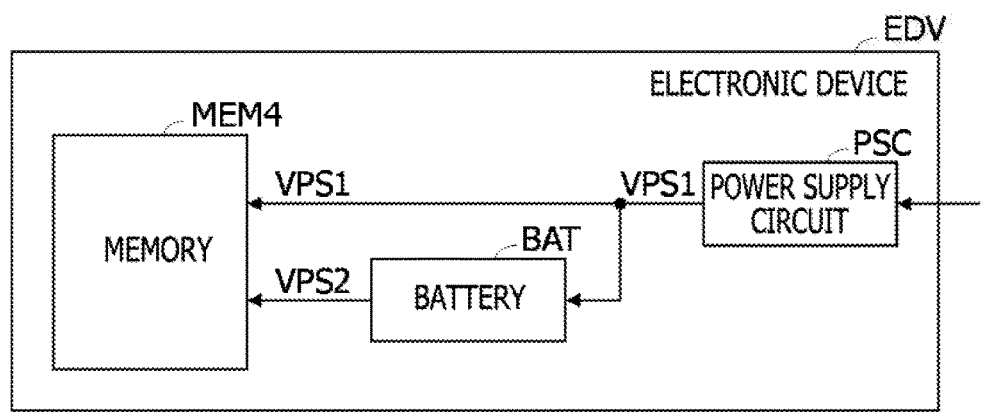
FIG. 12 is a diagram illustrating an example of an electronic device including the memory illustrated in FIG. 10.

FIG. 12 illustrates an example of an electronic device EDV including the memory MEM4 illustrated in FIG. 10.

The electronic device EDV is, for example, an information processor such as a computer. For example, the electronic device EDV includes a power supply circuit PSC, a battery BAT and a memory MEM4. The power supply circuit PSC receives an alternating current (AC) voltage from an AC power supply, and generates a direct current (DC) voltage. Thereafter, the power supply circuit PSC supplies the DC voltage, generated from the AC voltage, to the memory MEM4, the battery BAT and the like. In this respect, the thus-generated DC voltage serves as the first power supply voltage VPS1. The battery BAT is, for example, a rechargeable battery. Based on electric charges charged in the battery BAT by the first power supply voltage VPS1, the battery BAT generates the second power supply voltage VPS2. Thereafter, the battery BAT supplies the second power supply voltage VPS2 to the memory MEM4 and the like.

The memory MEM4 is the memory MEM4 discussed using FIG. 10. For example, when the supply of the first power supply voltage VPS1 stops, the memory MEM4 starts to perform the hold time control on the memory transistors MT of the hold time control targets. For example, in a case where as a result of the theft or the like of the electronic device EDV, the supply of the AC voltage from the AC power supply stops, the memory MEM4 determines that the supply of the first power supply voltage VPS1 stops, and starts to perform the hold time control. Thus, the data written to the memory transistors MT of the hold time control targets is erased once the predetermined hold time Thd elapses after the supply of the AC voltage from the AC power supply stops. In other words, the memory MEM4 is capable of keeping the data written to the memory transistors MT of the hold time control targets from leaking out.

The configuration of the electronic device EDV is not limited to the example illustrated in FIG. 12. For example, the electronic device EDV may include a primary battery, such as a dry battery, instead of the battery BAT.

As described above, the embodiment discussed using FIGS. 10 and 12 is capable of bringing about the same effect as does the embodiment discussed using FIGS. 2 to 7. For example, the embodiment is capable of reducing the variation in the hold time compared with the control method depending on the natural discharge. In other words, the embodiment is capable of controlling the data hold time accurately. Furthermore, depending on what purpose or the like the memory MEM4 serves, the embodiment is capable of changing the ratio between the memory cells MC in which the data hold time is set at the predetermined hold time Thd and the memory cells MC in which the data hold time is not set at the predetermined hold time Thd.

The controller CTL4 starts to perform the hold time control when the supply of the first power supply voltage VPS1 stops. For example, in the case where the supply of the first power supply voltage VPS1 stops as a result of the theft or the like of the electronic device EDV in which the memory MEM4 is mounted, the memory MEM4 starts to perform the hold time control. Thereby, the embodiment is capable of keeping the data written to the memory transistors MT of the hold time control targets from leaking out.

Figure 13:
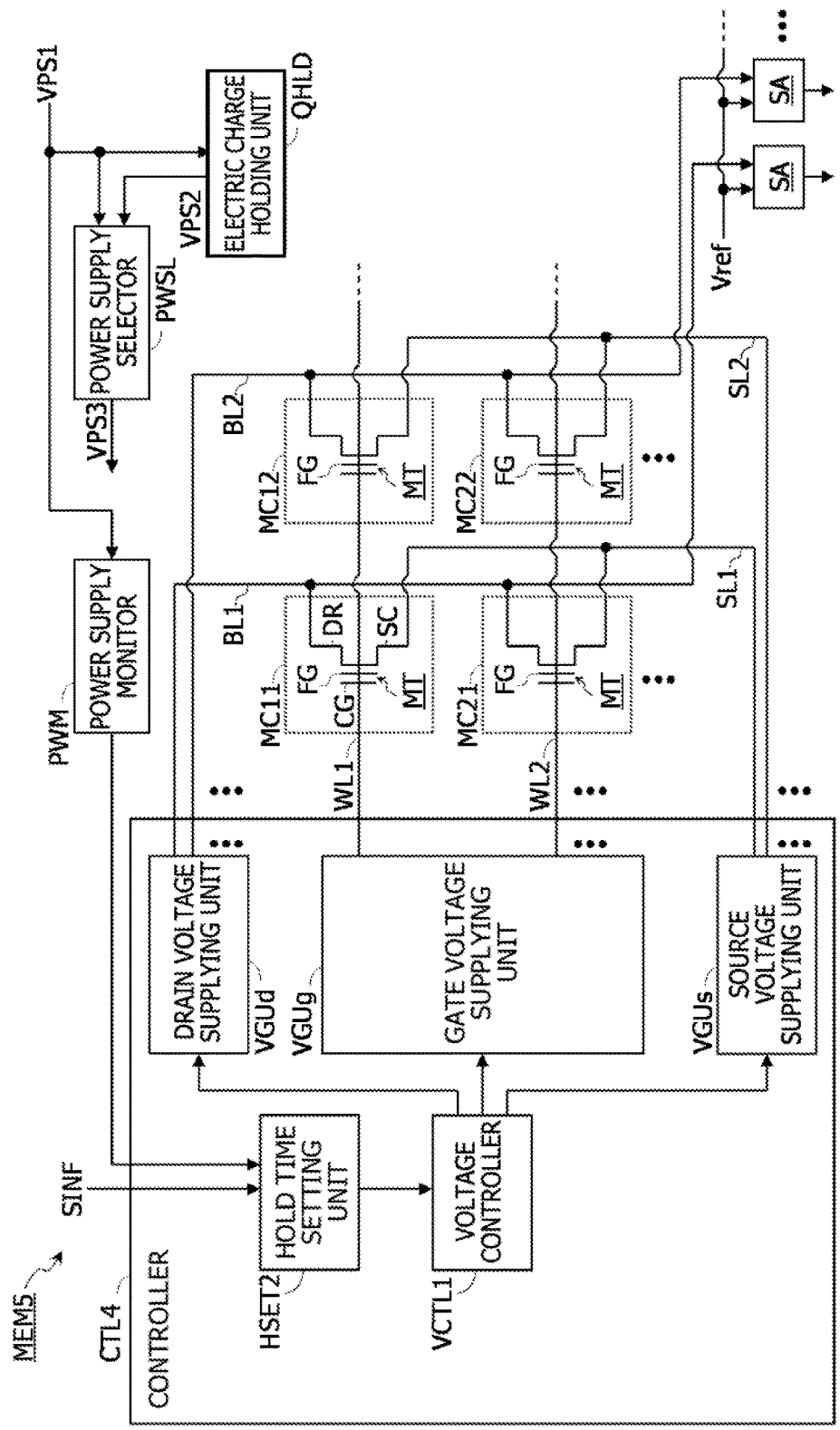
FIG. 13 is a diagram illustrating a memory and a memory control method of still another embodiment.

FIG. 13 illustrates a memory and a memory control method of still another embodiment. Components which are the same as or similar to those discussed using FIGS. 1 to 12 are will be denoted by the same or similar reference signs, and detailed descriptions for such components will be omitted. A memory MEM5 illustrated in FIG. 13 is the same as or similar to the memory MEM4, except that the memory MEM 5 is obtained by adding an electric charge holding unit QHLD to the memory MEM4 illustrated in FIG. 10. Thus, an electronic device in which the memory MEM5 is mounted is the same as or similar to the electronic device EDV illustrated in FIG. 12, except that the electronic device includes the electric charge holding unit QHLD provided inside the memory MEM5 instead of the battery BAT illustrated in FIG. 12.

For example, the memory MEM5 includes: multiple non-volatile memory cells MC (MC11, MC12, MC21, MC22, ... ) arrayed in a matrix layout; the controller CTL4; the multiple sense amplifiers SA; the power supply selector PWSL; the power supply monitor PWM; and the electric charge holding unit QHLD.

The electric charge holding unit QHLD holds electric charges based on the first power supply voltage VPS1, and generates the second power supply voltage VPS2 based on the thus-held electric charges. In other words, the electric charge holding unit QHLD generates the second power supply voltage VPS2 based on electric charges charged in the electric charge holding unit QHLD by the first power supply voltage VPS1. Thereafter, the electric charge holding unit QHLD outputs the second power supply voltage VPS2 to the power supply selector PWSL.

The memory cells MC, the controller CTL4, the sense amplifiers SA, the power supply selector PWSL and the power supply monitor PWM are the same as or similar to the memory cells MC, the controller CTL4, the sense amplifiers SA, the power supply selector PWSL and the power supply monitor PWM which are illustrated in FIG. 10.

Meanwhile, the configuration of the memory MEM5 is not limited to the example illustrated in FIG. 13. The power supply monitor PWM, the power supply selector PWSL and the electric charge holding unit QHLD may be added to the memory MEM3 illustrated in FIG. 8. In this case, the memory MEM3 illustrated in FIG. 8 includes the hold time setting unit HSET2 instead of the hold time setting unit HSET1.

As described above, the embodiment discussed using FIG. 13 is capable of bringing about the same effect as does the embodiment discussed using FIG. 10 to FIG. 12. For example, the embodiment is capable of reducing the variation in the hold time compared with the control method depending on the natural discharge. Furthermore, depending on what purpose or the like the memory MEM5 serves, the embodiment is capable of changing the ratio between the memory cells MC in which the data hold time is set at the predetermined hold time Thd and the memory cells MC in which the data hold time is not set at the predetermined hold time Thd. Moreover, for example, in the case where as a result of the theft or the like of the electronic device in which the memory MEM5 is mounted, the supply of the first power supply voltage VPS1 stops, the memory MEM5 starts to perform the hold time control. Thereby, the embodiment is capable of keeping the data written to the memory transistors MT of the hold time control targets from leaking out.

The features and advantages of the embodiments will become apparent from the foregoing detailed descriptions. The scope of the claims is intended to cover the features and advantages of the embodiments without departing from the spirit and the scope of the right. In addition, those having ordinary knowledge in the relevant technical field could easily arrive at all the modifications and changes. Accordingly, the scope of the embodiments representing the inventive steps shall not be limited to what have been discussed, and covers appropriate improvements and equivalents which fall within the disclosed scope of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory comprising:
   a memory cell including a memory transistor in which electric charges are stored in an electric charge storage layer when data is written to the memory cell, the memory transistor including a control node for controlling discharge speed of the electric charges from the electric charge storage layer in accordance with a control voltage of the control node; and
   a controller configured to control the control voltage in accordance with a predetermined hold time until an amount of electric charges stored in the electric charge storage layer decreases to an amount of electric charges corresponding to a state where the data is erased from the memory cell.

2. The memory according to claim 1, comprising a plurality of the memory cells, wherein the controller sets a data hold time at the predetermined hold time in one of the plurality of the memory cells, and controls the control voltage of the memory cell in which the data hold time is set at the predetermined hold time.

3. The memory according to claim 2, wherein the controller controls the data hold time in each of the plurality of the memory cells.

4. The memory according to claim 1, wherein depending on the predetermined hold time, the controller sets values of control voltages to be applied respectively to the control node, a source and a drain of the memory transistor.

5. The memory according to claim 1, further comprising:
   a power supply selector configured to select one of a first power supply voltage and a second power supply voltage as an internal power supply voltage; and
   a power supply monitor configured to determine whether the first power supply voltage stops being supplied, wherein
   when the first power supply voltage stops being supplied, the controller starts to control the control voltage.

6. The memory according to claim 5, further comprising an electric charge holding unit configured to hold electric charges based on the first power supply voltage, and to generate the second power supply voltage based on the thus-held electric charges.

7. The memory according to claim 1, wherein when data write is completed, the controller starts to control the control voltage.

8. A memory control method, the memory including a memory cell, comprising:
   storing electric charges in an electric charge storage layer of a memory transistor being included in the memory cell for writing data to the memory cell, the memory transistor including a control node for controlling discharge speed of the electric charges from the electric charge storage layer in accordance with a control voltage of the control node; and
   controlling the control voltage in accordance with a predetermined hold time until an amount of electric charges stored in the electric charge storage layer decreases to an amount of electric charges corresponding to a state where the data is erased from the memory cell.

* * * * *